United States Patent
Han et al.

(10) Patent No.: US 10,854,815 B2
(45) Date of Patent: Dec. 1, 2020

(54) METHOD AND APPARATUS FOR MANUFACTURING DISPLAY APPARATUS

(71) Applicant: Samsung Display Co., Ltd., Yongin-si (KR)

(72) Inventors: Sangjin Han, Yongin-si (KR); Junha Park, Yongin-si (KR); Eugene Kang, Yongin-si (KR); Dongwook Kim, Yongin-si (KR); Cheollae Roh, Yongin-si (KR); Jaewan Seol, Yongin-si (KR); Seongho Jeong, Yongin-si (KR); Myungsoo Huh, Yongin-si (KR); Mingyu Seo, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 16/427,091

(22) Filed: May 30, 2019

(65) Prior Publication Data

US 2020/0035920 A1 Jan. 30, 2020

(30) Foreign Application Priority Data

Jul. 30, 2018 (KR) .................. 10-2018-0088668

(51) Int. Cl.
*H01L 21/00* (2006.01)
*H01L 27/00* (2006.01)
(Continued)

(52) U.S. Cl.
CPC .......... *H01L 51/001* (2013.01); *C23C 14/042* (2013.01); *C23C 14/24* (2013.01);
(Continued)

(58) Field of Classification Search
CPC ..... C23C 14/044; C23C 14/54; C23C 14/243; C23C 14/56; C23C 14/546; C23C 14/042;
(Continued)

(56) References Cited

U.S. PATENT DOCUMENTS 7,067,170 B2 * 6/2006 Marcus ............... H01L 51/0002
427/255.6
2003/0203638 A1 10/2003 Van Slyke
(Continued)

FOREIGN PATENT DOCUMENTS

JP 9-209131 A 8/1997
JP 2009-97044 A 5/2009
(Continued)

OTHER PUBLICATIONS

EPO Partial Seach Report dated Dec. 3, 2019, for corresponding European Patent Application No. 19178576.5 (16 pages).
(Continued)

*Primary Examiner* — Nikolay K Yushin
(74) *Attorney, Agent, or Firm* — Lewis Roca Rothgerber Christie LLP

(57) ABSTRACT

An apparatus for manufacturing a display apparatus includes: a chamber; a plurality of source units outside the chamber, wherein the plurality of source units which accommodate a deposition material and transform the deposition material into gas; a nozzle unit in the chamber, wherein the nozzle unit is connected to the plurality of source units and injects, into the chamber, the deposition material supplied from one of the plurality of source units; and a regulating unit between each of the plurality of source units and the
(Continued)

nozzle unit, wherein the regulating unit interrupts the deposition material supplied from each of the plurality of source units to the nozzle unit and selectively connects the plurality of source units with the nozzle unit.

56 Claims, 17 Drawing Sheets

(51) Int. Cl.
 *H01L 51/00*  (2006.01)
 *C23C 14/04*  (2006.01)
 *C23C 14/24*  (2006.01)
 *C23C 14/54*  (2006.01)
 *H01L 21/66*  (2006.01)
 *H01L 27/32*  (2006.01)
 *H01L 51/56*  (2006.01)
 *H01L 51/50*  (2006.01)

(52) U.S. Cl.
 CPC .............. *C23C 14/54* (2013.01); *H01L 22/10* (2013.01); *H01L 27/3244* (2013.01); *H01L 51/0011* (2013.01); *H01L 51/56* (2013.01); *H01L 51/5012* (2013.01); *H01L 51/5056* (2013.01); *H01L 51/5072* (2013.01); *H01L 51/5088* (2013.01); *H01L 51/5092* (2013.01); *H01L 2227/323* (2013.01)

(58) Field of Classification Search
 CPC ... C23C 14/24; C23C 14/246; H01L 51/0011; H01L 51/001; H01L 51/56; H01L 51/5072; H01L 51/5092; H01L 51/5088; H01L 51/5056; H01L 51/5012; H01L 22/10; H01L 22/22; H01L 22/20; H01L 22/26; H01L 27/3244; H01L 27/3246; H01L 27/3211; H01L 27/326; H01L 27/124; H01L 2227/323

See application file for complete search history.

(56) References Cited

U.S. PATENT DOCUMENTS

| | | |
|---|---|---|
| 2004/0062856 A1 | 4/2004 | Marcus et al. |
| 2010/0092665 A1 | 4/2010 | Sudou |
| 2011/0042208 A1 | 2/2011 | Negishi et al. |
| 2012/0024228 A1 | 2/2012 | Lee |
| 2012/0114840 A1 | 5/2012 | Fukuda et al. |
| 2012/0174865 A1 | 7/2012 | Choi et al. |
| 2012/0299024 A1 | 11/2012 | Lee et al. |
| 2013/0273746 A1 | 10/2013 | Kawato et al. |
| 2017/0159167 A1 | 6/2017 | Oh et al. |

FOREIGN PATENT DOCUMENTS

| | | |
|---|---|---|
| JP | 2012-112034 A | 6/2012 |
| JP | 5220091 B2 | 6/2013 |
| JP | 5298189 B2 | 6/2013 |
| JP | 2013-204073 A | 10/2013 |
| JP | 2014-70969 A | 4/2014 |
| KR | 2002-0036210 A | 5/2002 |
| KR | 10-2012-0007216 A | 1/2012 |
| KR | 10-2012-0081811 A | 7/2012 |
| KR | 10-2012-0131544 A | 12/2012 |
| KR | 10-2014-0055721 A | 5/2014 |
| KR | 10-2016-0005875 A | 1/2016 |
| WO | WO 2012/046795 A1 | 4/2012 |
| WO | WO 2017/121491 A1 | 7/2017 |

OTHER PUBLICATIONS

Extended European Search Report for corresponding European Patent Application No. 19178576.5, dated May 4, 2020, 19 pages.

* cited by examiner

METHOD AND APPARATUS FOR MANUFACTURING DISPLAY APPARATUS

CROSS-REFERENCE TO RELATED APPLICATION

This application claims priority to and the benefit of Korean Patent Application No. 10-2018-0088668, filed on Jul. 30, 2018, in the Korean Intellectual Property Office, the disclosure of which is incorporated herein in its entirety by reference.

BACKGROUND

1. Field

One or more embodiments relate to an apparatus for manufacturing a display apparatus and a method of manufacturing the display apparatus.

2. Description of the Related Art

Mobile electronic devices are widely used. Recently, in addition to small electronic devices such as mobile phones, etc., tablet personal computers (PCs) are in wide use as mobile electronic devices.

Such mobile electronic devices include a display apparatus for providing a user with visual information, such as images or videos, in order to support various functions. As components for driving display apparatuses have been reduced in size, display apparatuses have come to occupy an increased proportion in electronic devices, and structures for bending a flat display apparatus by certain angles may be utilized.

In order to manufacture a display apparatus, various layers may be formed. In addition, in general, an apparatus for manufacturing a display apparatus is used to form such layers, and manufactures a plurality of display apparatuses in a single operation. Here, the apparatus for manufacturing the display apparatus may restart operation after a certain period of time after being repaired in order to replace internal components, etc.

The above information disclosed in this Background section is only for enhancement of understanding of the background of the invention and therefore information in this Background section does not necessarily constitute prior art.

SUMMARY

One or more embodiments relate to an apparatus for manufacturing a display apparatus and a method of manufacturing the display apparatus.

When a display apparatus is manufactured by an operation of an apparatus for manufacturing a display apparatus, and when the operation of the apparatus for manufacturing a display apparatus is stopped in order to replace components of the apparatus, manufacturing efficiency may be decreased.

One or more embodiments include an apparatus for manufacturing a display apparatus and a method of manufacturing a display apparatus, whereby the apparatus for manufacturing a display apparatus does not stop operating when components of the apparatus are being replaced, or the components are recyclable.

Additional aspects will be set forth in part in the description which follows and, in part, will be apparent from the description, or may be learned by practice of the presented embodiments.

According to one or more embodiments, an apparatus for manufacturing a display apparatus includes: a chamber; a plurality of source units outside the chamber, wherein the plurality of source units accommodate a deposition material and transform the deposition material into gas; a nozzle unit in the chamber and connected to the plurality of source units, wherein the nozzle unit injects, into the chamber, the deposition material supplied from one of the plurality of source units; and a regulating unit between each of the plurality of source units and the nozzle unit, wherein the regulating unit controls the deposition material supplied from each of the plurality of source units to the nozzle unit and selectively connects the plurality of source units with the nozzle unit.

The apparatus may further include a sensor unit in each of the plurality of source units and configured to measure an inner temperature of each of the plurality of source units.

The regulating unit may disconnect, from the nozzle unit, a source unit from among the plurality of source units, of which the inner temperature is greater than a pre-set temperature, and may connect, to the nozzle unit, a source unit from among the plurality of source units, of which the inner temperature is equal to or less than the pre-set temperature.

Each of the plurality of source units may be replaceable.

The apparatus may further include a source chamber unit, in which at least one of the plurality of source units is arranged.

The nozzle unit may include: a first nozzle unit connected to at least one of the plurality of source units; and a second nozzle unit separated from the first nozzle unit and connected to at least one other source unit among the plurality of source units.

A first nozzle of the first nozzle unit and a second nozzle of the second nozzle unit may be between a center of the first nozzle unit and a center of the second nozzle unit.

The first nozzle and the second nozzle may be arranged in a line.

One of the first nozzle and the second nozzle may be inside the other of the first nozzle and the second nozzle.

At least one of the first nozzle and the second nozzle may be inclined.

The deposition material injected from the first nozzle unit and the deposition material injected from the second nozzle unit may be different from each other.

The apparatus may further include an angle restriction unit in the nozzle unit or apart from the nozzle unit, and the angle restriction unit may restrict an injection angle of the deposition material injected from the nozzle unit.

The apparatus may further include a heating unit in at least a portion of the angle restriction unit, and the heating unit may heat the at least a portion of the angle restriction unit.

The angle restriction unit may include an angle restriction belt, and a belt driving unit which rotates the angle restriction belt.

The angle restriction unit may further include a belt cooling unit which cools a surface of the angle restriction belt.

The angle restriction unit may further include a belt heating unit which heats a surface of the angle restriction belt.

The apparatus may further include a deposition material collecting unit apart from the angle restriction belt, and the deposition material collecting unit may collect at least a portion of the deposition material escaping from the angle restriction belt due to heating by the belt heating unit.

The apparatus may further include a sensor unit which measures a concentration of the deposition material injected from the nozzle unit.

The apparatus may further include a rotation driving unit which is connected to the sensor unit and rotates the sensor unit, and a sensor heating unit which removes the deposition material from the sensor unit by heating the sensor unit.

According to one or more embodiments, an apparatus for manufacturing a display apparatus includes: a chamber; a first source unit accommodating a first deposition material and including a first nozzle, wherein the first nozzle supplies the first deposition material into the chamber; and a second source unit accommodating a second deposition material and including a second nozzle, wherein the second nozzle supplies the second deposition material into the chamber, wherein the first nozzle and the second nozzle are between a center of the first source unit and a center of the second source unit.

At least one of the first nozzle and the second nozzle may be inclined.

The first nozzle and the second nozzle may be arranged in a line.

One of the first nozzle and the second nozzle may be inside the other of the first nozzle and the second nozzle.

The apparatus may further include an angle restriction unit in at least one of the first source unit and the second source unit or apart from at least one of the first source unit and the second source unit, and the angle restriction unit may restrict an injection angle of at least one of the first deposition material injected from the first nozzle and the second deposition material injected from the second nozzle.

The apparatus may further include a heating unit which removes at least one of the first deposition material and the second deposition material deposited on the angle restriction unit.

The apparatus may further include a sensor unit which measures at least one of a concentration of the first deposition material injected from the first nozzle and a concentration of the second deposition material injected from the second nozzle.

The apparatus may further include a rotation driving unit which is connected to the sensor unit and rotates the sensor unit, and a sensor heating unit which removes at least one of the first and second deposition materials from the sensor unit by heating the sensor unit.

According to one or more embodiments, an apparatus for manufacturing a display apparatus includes: a chamber; a source unit in the chamber, wherein the source unit supplies a deposition material into the chamber; an angle restriction belt in the source unit or apart from the source unit, wherein the angle restriction belt rotates and restricts an injection angle of the deposition material injected from the source unit; a belt driving unit which rotates the angle restriction belt; a belt cooling unit which cools a surface of the angle restriction belt; and a belt heating unit which heats the surface of the angle restriction belt.

The apparatus may further include a deposition material collecting unit apart from the angle restriction belt, and the deposition material collecting unit may collect at least a portion of the deposition material escaping from the angle restriction belt due to heating by the belt heating unit.

The apparatus may further include a sensor unit which measures a concentration of the deposition material injected from the source unit.

The apparatus may further include a rotation driving unit which is connected to the sensor unit and rotates the sensor unit, and a sensor heating unit which removes the deposition material from the sensor unit by heating the sensor unit.

According to one or more embodiments, an apparatus for manufacturing a display apparatus includes: a chamber; a source unit in the chamber, wherein the source unit supplies a deposition material into the chamber; a sensor unit which measures a concentration of the deposition material injected from the source unit; a rotation driving unit which is connected to the sensor unit and rotates the sensor unit; and a sensor heating unit which removes the deposition material from the sensor unit by heating the sensor unit.

According to one or more embodiments, a method of manufacturing a display apparatus includes: arranging a display panel and a mask assembly in a chamber; supplying, into the chamber, a deposition material from at least one of a plurality of source units and depositing the deposition material on the display panel; measuring an inner temperature of at least one of the plurality of source units; and comparing the measured inner temperature of the at least one of the plurality of source units with a pre-set temperature, and interrupting the deposition material supplied from the at least one of the plurality of source units into the chamber and supplying the deposition material from at least another of the plurality of source units into the chamber.

The plurality of source units may be accommodated in a source chamber unit which is different from the chamber.

The plurality of source units may be outside the chamber, and a nozzle unit in the chamber may be connected to the plurality of source units and may inject the deposition material into the chamber.

At least one of the plurality of source units may supply, into the chamber, the deposition material, which is different from the deposition material supplied from at least another of the plurality of source units.

Each of the plurality of source units may include a nozzle unit which guides the deposition material, and the nozzle units of the source units adjacent to each other may be between centers of the source units adjacent to each other.

Each of the plurality of source units may include a nozzle unit which guides the deposition material, and the nozzle units of the source units adjacent to each other may be arranged in a row.

Each of the plurality of source units may include a nozzle unit which guides the deposition material, and one of the nozzle units of the source units adjacent to each other may be in another of the nozzle units of the source units adjacent to each other.

An angle of the deposition material supplied from each of the plurality of source units may be restricted by an angle restriction unit in at least one of the plurality of source units or apart from at least one of the plurality of source units.

The method may further include removing the deposition material deposited on the angle restriction unit by heating the angle restriction unit.

The method may further include allowing the deposition material to be deposited on the angle restriction unit via adsorbing heat of the angle restriction unit.

The method may further include measuring, via a first sensor unit, an evaporation rate of the deposition material supplied from the at least one of the plurality of source units.

The method may further include replacing the first sensor unit with a second sensor unit which is different from the first sensor unit, after a certain time period.

The method may further include removing the deposition material deposited on the first sensor unit by heating the first sensor unit.

According to one or more embodiments, a method of manufacturing a display apparatus includes: arranging a display panel and a mask assembly in a chamber; and supplying, into the chamber, a first deposition material from a first source unit and supplying, into the chamber, a second deposition material from a second source unit, and depositing the first deposition material and the second deposition material on the display panel, the first source unit may include a first nozzle which guides the first deposition material, the second source unit may include a second nozzle which guides the second deposition material, and the first nozzle and the second nozzle may be between a center of the first source unit and a center of the second source unit.

The first nozzle and the second nozzle may be arranged in a line.

One of the first nozzle and the second nozzle may be in the other of the first nozzle and the second nozzle.

The method may further include restricting injection angles of the first deposition material and the second deposition material via an angle restriction unit in at least one of the first nozzle and the second nozzle or apart from at least one of the first nozzle and the second nozzle.

The method may further include removing at least one of the first and second deposition materials deposited on the angle restriction unit by heating the angle restriction unit.

The method may further include allowing at least one of the first and second deposition materials to be deposited on the angle restriction unit via adsorbing heat of the angle restriction unit.

The method may further include measuring, via a first sensor unit, an evaporation rate of at least one of the first and second deposition material supplied from at least one of the first and second source units.

The method may further include replacing the first sensor unit with a second sensor unit which is different from the first sensor unit, after a certain time period.

The method may further include heating the first sensor unit and thereby removing at least one of the first and second deposition materials deposited on the first sensor unit.

According to one or more embodiments, a method of manufacturing a display apparatus includes: arranging a display panel and a mask assembly in a chamber; supplying, into the chamber, a deposition material from a source unit and depositing the deposition material on the display panel; measuring, via a first sensor unit, an evaporation rate of the deposition material injected from the source unit; and replacing the first sensor unit with a second sensor unit which is different from the first sensor unit, after a certain time period.

The method may further include heating the first sensor unit which is replaced, thereby removing the deposition material deposited on the first sensor unit.

BRIEF DESCRIPTION OF THE DRAWINGS

These and/or other aspects will become more apparent and more readily appreciated from the following description of the embodiments, taken in conjunction with the accompanying drawings in which.

DETAILED DESCRIPTION

Figure 1:
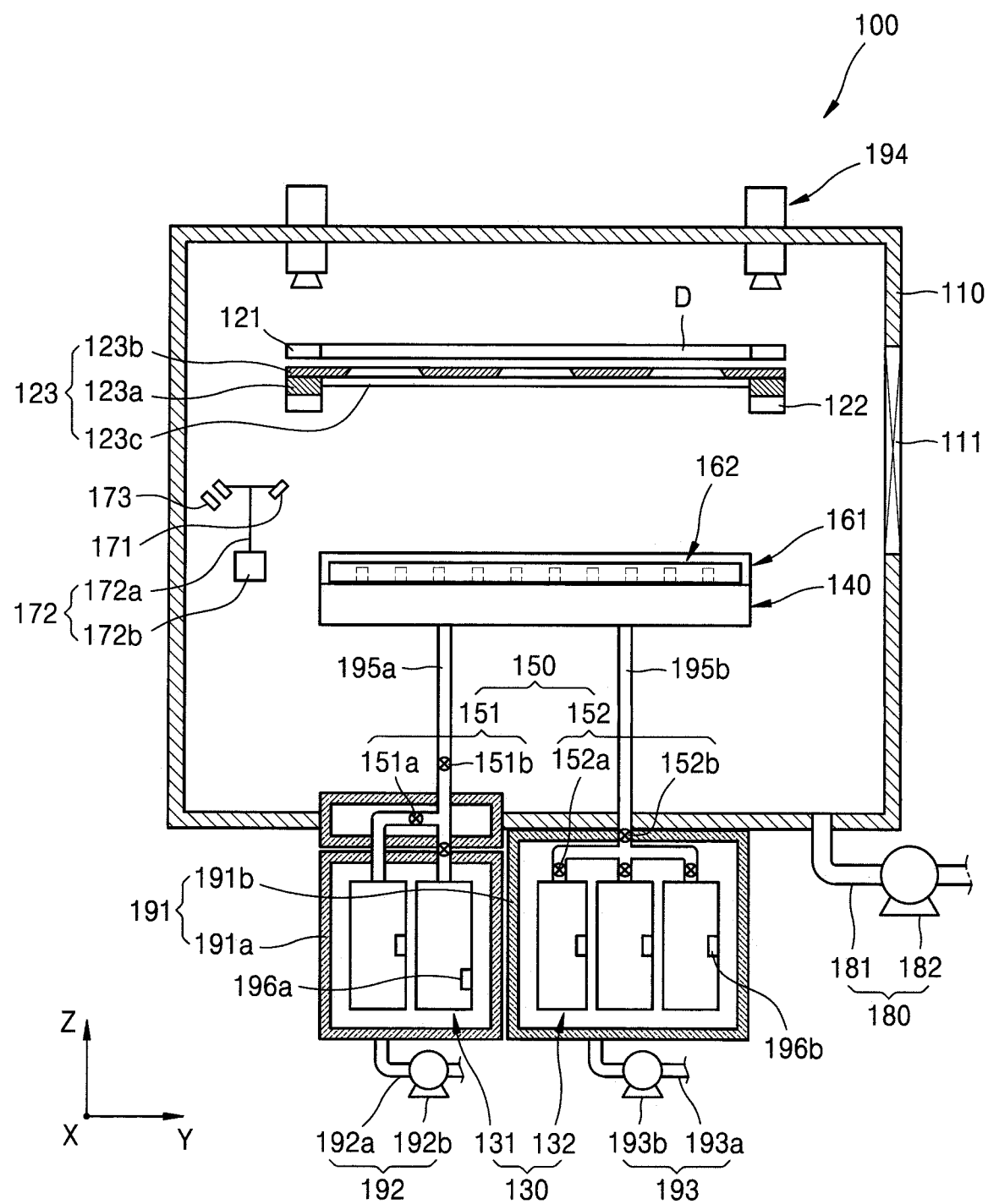
FIG. 1 is a cross-sectional view of an apparatus for manufacturing a display apparatus, according to some example embodiments.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, aspects of some example embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that although the terms "first," "second," etc. may be used herein to describe various components, these components should not be limited by these terms. These components are only used to distinguish one component from another.

As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components may be present.

Sizes of elements in the drawings may be exaggerated for convenience of explanation. In other words, because sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

In embodiments hereinafter, when a layer, an area, a component, etc. are referred to as being connected to another layer, another area, another component, etc., they may be directly connected to the other layer, the other area, the other component, etc., or may be indirectly connected to the other layer, the other area, the other component, etc., with another layer, another area, another component, etc., interposed therebetween. For example, in this specification, when a layer, an area, a component, etc., are referred to as being electrically connected to another layer, another area, another component, etc., they may be directly electrically connected to the other layer, the other area, the other component, etc., or may be indirectly electrically connected to the other layer, the other area, the other component, etc., with another layer, another area, another component, etc., interposed therebetween.

Figure 2:
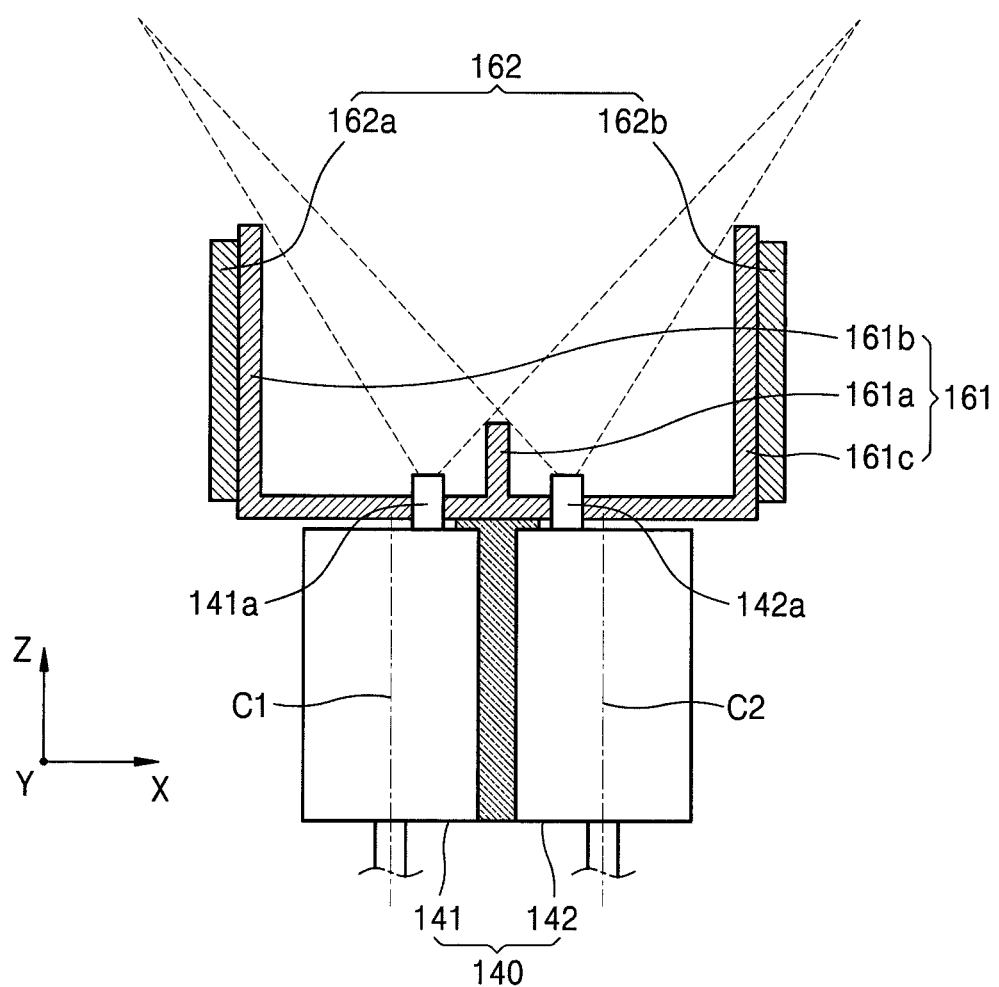
FIG. 2 is a cross-sectional view of a nozzle unit and an angle restriction unit, illustrated in FIG. 1.
Figure 3:
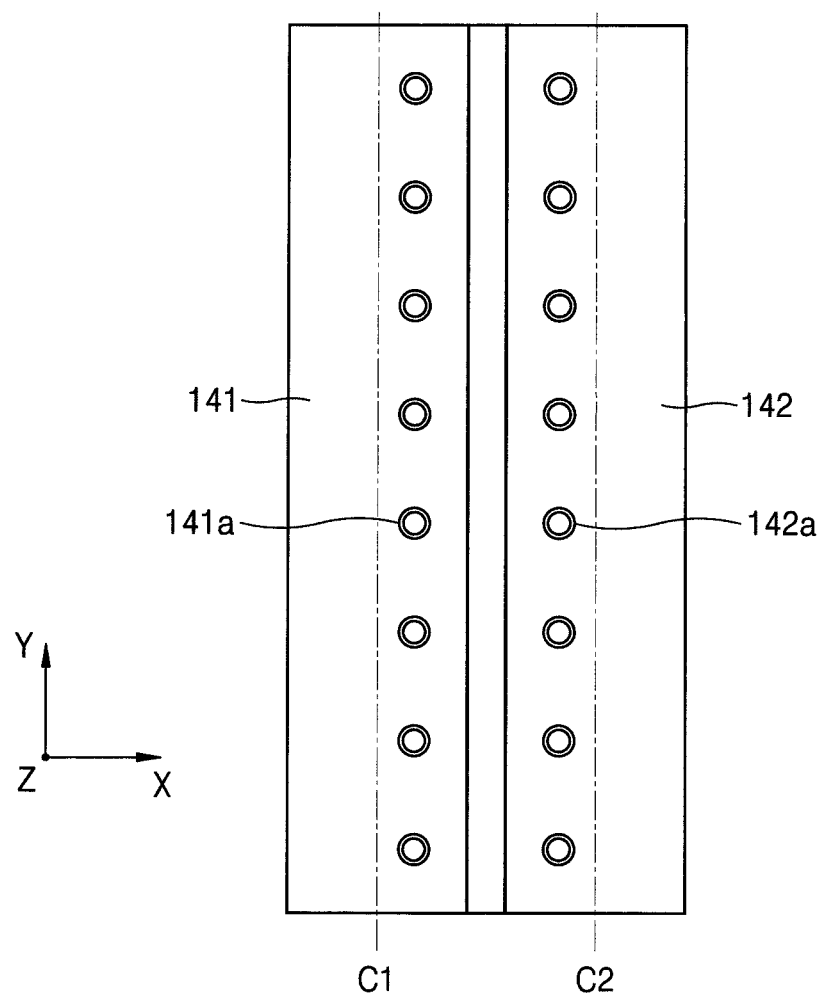
FIG. 3 is a plan view of the nozzle unit illustrated in FIG. 2.

FIG. 1 is a cross-sectional view of an apparatus 100 for manufacturing a display apparatus, according to some example embodiments. FIG. 2 is a cross-sectional view of a nozzle unit (or nozzle) 140 and an angle restriction unit (or angle restrictor) 161, illustrated in FIG. 1. FIG. 3 is a plan view of the nozzle unit 140 illustrated in FIG. 2.

Referring to FIGS. 1 through 3, the apparatus 100 for manufacturing a display apparatus may include a chamber 110, a first supporting unit 121, a second supporting unit 122, a mask assembly 123, a source unit 130, the nozzle unit 140, a regulating unit (or regulator) 150, the angle restriction unit 161, a heating unit (or heater) 162, a sensor unit (or sensor) 171, a rotation driving unit 172, a sensor heating unit (or sensor heater) 173, a first pressure adjusting unit (or first pressure adjustor) 180, a source chamber unit 191, a second pressure adjusting unit (or second pressure adjustor) 192, a third pressure adjusting unit (or third pressure adjustor) 193, and a vision unit 194.

The chamber 110 may have an inner space. The chamber 110 may be formed to have an open portion (e.g., an internal cavity or space within the body of the chamber 110), and a gate valve 111, etc., may be arranged in the open portion of the chamber 110 to open or close the open portion of the chamber 110.

The first supporting unit 121 may be arranged in the chamber 110 and may support a display substrate D. The first supporting unit 121 may have various shapes. According to an embodiment, the first supporting unit 121 may include a clamp and grip the display substrate D. According to some embodiments, the first supporting unit 121 may be arranged to be fixed in the chamber 110 and may support the display substrate D. According to some embodiments, the first supporting unit 121 may include an electrostatic chuck, a vacuum chuck, or an adhesive chuck arranged above the chamber 110 and fixing the display substrate D. According to some embodiments, the first supporting unit 121 may include a shuttle, in which the display substrate D is mounted or fixed or which allows the display substrate D to linearly move in a direction. The first supporting unit 121 is not limited thereto and may include all devices and structures configured to fix the display substrate D or allow the display substrate D to perform linear motion. However, hereinafter, for convenience of explanation, a case in which the first supporting unit 121 is arranged to be fixed in the chamber 110 and the display substrate D is mounted in the first supporting unit 121 will be mainly described in more detail.

The second supporting unit 122 may support the mask assembly 123. Here, the second supporting unit 122 may be formed to be the same or substantially the same as the first supporting unit 121 and may fix the mask assembly 123. Also, the second supporting unit 122 may allow the mask assembly 123 to ascend or descend in a certain range of distances or may rotate the mask assembly 123 in a certain range of angles. Also, the second supporting unit 122 may linearly move the mask assembly 123 in a certain range of distances in various directions.

The mask assembly 123 may include a mask frame 123a and a mask 123b. The mask frame 123a may be formed as a grid shape and may have an open portion in a center thereof. In this case, the open portion may be singularly formed or may be separated into a plurality of openings. When the opening is separated into a plurality of openings, at least one supporting frame 123c may be arranged in the open portion to separate the open portion into the plurality of openings. Here, the supporting frame 123c may be arranged in a longitudinal direction or a width direction with respect to the mask frame 123a. The mask 123b may be arranged above the mask frame 123a. Here, the mask 123b may be singularly arranged in the mask frame 123a or arranged in the mask frame 123a in a multiple number. When a plurality of masks 123b are arranged in the mask frame 123a, the plurality of masks 123b may be arranged in a direction and may close the open portion of the mask frame 123a. Hereinafter, for convenience of explanation, a case in which the mask 123b is singularly formed in the mask frame 123a and the mask 123b closes the open portion of the mask frame 123a will be mainly described in more detail. The mask 123b may have at least one opening. Here, when a plurality of openings are included in the mask 123b, the plurality of openings may be arranged in an area of the mask 123b to form a pattern. Also, when a plurality of openings are included in the mask 123b, the plurality of openings may be arranged in a plurality of areas of the mask 123b to be apart from one another, and may form patterns in the plurality of areas, respectively.

The source unit 130 may be arranged outside the chamber 110. Here, the source unit 130 may be provided in a multiple number. For example, the source unit 130 may include a first source unit 131 accommodating a first deposition material and a second source unit 132 accommodating a second deposition material. In this case, the first and second deposition materials may be different from each other. For example, one of the first and second deposition materials may include a host, and the other of the first and second deposition materials may include a dopant. The first source unit 131 and the second source unit 132 may be similarly formed to each other, and thus, hereinafter, descriptions will be given by focusing on the first source unit 131, for convenience of explanation.

The first deposition material may be accommodated in the first source unit 131. Here, the first source unit 131 may include a heater to heat the first deposition material. The first source unit 131 may be provided in a multiple number. The plurality of first source units 131 may be connected to a first supply pipe 195a and may be replaceable. Also, each of the plurality of first source units 131 may stop operating based on a state of each of the plurality of first source units 131. Here, a first temperature sensor 196a may be arranged in each first source unit 131. The first temperature sensor 196a may measure a temperature in each first source unit 131. A time to replace each first source unit 131 may be determined by comparing the temperature measured by the first temperature sensor 196a with a pre-set temperature. For example, when it is determined that the temperature measured by the first temperature sensor 196a is greater than the pre-set temperature, it may be determined that the first source unit 131 has to be replaced.

Similarly to the first source unit 131, the number of the second source unit 132 may be one or more, and the one or more second source units 132 may be connected to a second supply pipe 195b, which is different from the first supply pipe 195a. Also, a second temperature sensor 196b may be additionally arranged in each of the one more second source units 132 and may measure a temperature in each second source unit 132.

The nozzle unit 140 may include a first nozzle unit (or first nozzle) 141 connected to the first source unit 131 and a second nozzle unit (or second nozzle) 142 connected to the second source unit 132. Here, an insulation member may be arranged between the first nozzle unit 141 and the second nozzle unit 142. The first nozzle unit 141 may inject the first deposition material into the chamber 110 and the second nozzle unit 142 may inject the second deposition material into the chamber 110. In this case, the first nozzle unit 141 and the second nozzle unit 142 may be arranged to be spaced apart from each other, and the first and second deposition materials may be mixed with each other after being discharged to the outside of the first nozzle unit 141 and the second nozzle unit 142. Here, the first nozzle unit 141 may be connected to the first source unit 131 via the first supply pipe 195a and the second nozzle unit 142 may be connected to the second source unit 132 via the second supply pipe 195b. The first nozzle unit 141 and the second nozzle unit 142 may be formed to have a length in a direction of the display substrate D. For example, an upper surface of the first nozzle unit 141 and an upper surface of the second nozzle unit 142 each may be a rectangle having long sides and short sides. Here, a longitudinal direction of the first nozzle unit 141 and a longitudinal direction of the second nozzle unit 142 may be the same directions as the long sides of the first nozzle unit 141 and the long sides of the second nozzle unit 142, respectively.

The first nozzle unit 141 and the second nozzle unit 142 may include a first nozzle 141a and a second nozzle 142a, respectively, injecting the first deposition material and the second deposition material, respectively, into the chamber 110. Here, the first nozzle 141a and the second nozzle 142a may be arranged between a first center C1 of the first nozzle unit 141 and a second center C2 of the second nozzle unit 142. That is, the first nozzle 141a may be arranged in parallel to a longitudinal direction (for example, a Y direction of FIG. 1) of the first nozzle unit 141 and to be eccentric with respect to a straight line passing the first center C1. The second nozzle 142a may be arranged in parallel to a longitudinal direction (for example, the Y direction of FIG. 1) of the second nozzle unit 142 and to be eccentric with respect to a straight line passing the second center C2. In this case, the first nozzle 141a and the second nozzle 142a may be adjacent to each other so that an area in which the first deposition material injected from the first nozzle 141a and the second deposition material injected from the second nozzle 142a overlap each other may be increased.

Also, the first deposition material injected from the first nozzle 141a may have normal distribution based on a center of the first nozzle 141a. Also, the second deposition material injected from the second nozzle 142a may have normal distribution based on a center of the second nozzle 142a. In this case, a distance between an area in which the first deposition material injected from the first nozzle 141a becomes the highest and an area in which the second deposition material injected from the second nozzle 142a becomes the highest may be increased, so that the amount of the first deposition material and the amount of the second deposition material between the first nozzle 141a and the second nozzle 142a may be decreased, compared to other areas. However, by arranging the first nozzle 141a and the second nozzle 142a in the way described above, the area in which the first deposition material becomes the highest and the area in which the second deposition material becomes the highest may be between the first nozzle 141a and the second nozzle 142a. In this case, the ratio of the first deposition material and the second deposition material between the first nozzle 141a and the second nozzle 142a may be constant throughout an area between the first nozzle 141a and the second nozzle 142a when performing deposition.

Accordingly, according to the apparatus 100 for manufacturing the display apparatus and the method of manufacturing the display apparatus, an area in which the first deposition material is deposited and an area in which the second deposition material is deposited may become similar to each other, and thus, it is possible to form an area where a ratio of the first and second deposition materials is uniform throughout the region between the first nozzle 141a and the second nozzle 142a.

The regulating unit (or regulator) 150 may be arranged in at least one of the first supply pipe 195a and the second supply pipe 185b. For example, the regulating unit 150 may include a first regulating unit (or first regulator) 151 arranged in the first supply pipe 195a and a second regulating unit (or second regulator) 152 arranged in the second supply pipe 195b.

The first regulating unit 151 may control the first deposition material supplied from the first supply pipe 195a to the first nozzle unit 141. For example, the first regulating unit 151 may be provided in a multiple number. The plurality of first regulating units 151 may include at least one first sub-regulating unit (or first sub-regulator) 151a arranged in the first supply pipe 195a connected to each first source unit 131 and selectively connecting each first source unit 131 to the first nozzle unit 141. Also, the plurality of first regulating units 151 may include a first main regulating unit (or first main regulator) 151b arranged in a portion of the first supply pipe 195a, the portion being connected to the first nozzle unit 141, and selectively opening or closing between the plurality of first source units 131 and the first nozzle unit 141. In this case, the first sub-regulating unit 151a and the first main regulating unit 151b may not only selectively open or close the first supply pipe 195*a*, but also control the amount of the first deposition material passing through the first supply pipe 195*a*.

The second regulating unit 152 may be similarly formed to the first regulating unit 151. For example, the second regulating unit 152 may include a second sub-regulating unit (or second sub-regulator) 152*a* arranged in the second connection pipe 192*a* connected to each second source unit 132 and a second main regulating unit (or second main regulator) 152*b* arranged in the second connection pipe 192*a* connected to the second nozzle unit 142.

The angle restriction unit 161 may be arranged in at least one of the first nozzle unit 141 and the second nozzle unit 142 and may adjust an injection angle of the deposition material injected from the at least one of the first nozzle unit 141 and the second nozzle unit 142. Here, the injection angle of the deposition material may denote a range in which the deposition material is distributed from an end of the at least one of the first nozzle unit 141 and the second nozzle unit 142. Hereinafter, for convenience of explanation, descriptions will be given in more detail by focusing on a case in which the angle restriction unit 161 restricts the injection angles of the deposition materials injected from the first nozzle unit 141 and the second nozzle unit 142.

The angle restriction unit 161 may be formed to have a shape of a plate and may be arranged in the first nozzle unit 141 and the second nozzle unit 142. Here, the angle restriction unit 161 may include a first angle restriction plate 161*a* arranged at a side surface of the first nozzle unit 141, a second angle restriction plate 161*b* arranged between the first nozzle unit 141 and the second nozzle unit 142, and a third angle restriction plate 161*c* arranged at a side surface of the second nozzle unit 142.

The heating unit (or heater) 162 may be arranged in the angle restriction unit 161 and may apply heat to the angle restriction unit 161. Here, the heating unit 162 may be arranged in at least one of the first angle restriction plate 161*a* through the third angle restriction plates 161*c*. Hereinafter, for convenience of explanation, descriptions will be given in more detail by focusing on a case in which the heating unit 162 is arranged in the first angle restriction plate 161*a* and the third angle restriction plate 161*c*.

The heating unit 162 may include a first heating unit (or first heater) 162*a* coupled to the first angle restriction plate 161*a* and a second heating unit (or second heater) 162*b* coupled to the third angle restriction plate 161*c*. The first heating unit 162*a* and the second heating unit 162*b* may include heaters. Here, the first heating unit 162*a* and the second heating unit 162*b* may apply heat to the first angle restriction plate 161*a* and the third angle restriction plate 161*c*, respectively, thereby removing the deposition materials deposited on the first angle restriction plate 161*a* and the third angle restriction plate 161*c*.

The sensor unit 171 may measure the amount of the deposition materials which are evaporated or the amount of the deposition materials which are deposited on the display substrate D, the deposition materials being injected from the first nozzle unit 141 and the second nozzle unit 142. In this case, the sensor unit 171 may include a quartz crystal microbalance (QCM) sensor. The sensor unit 171 may be provided in a multiple number. Here, the plurality of sensor units 171 may be arranged to face one another.

The rotation driving unit (or rotation driver) 172 may fix the sensor unit 171 and may change a location of the sensor unit 171. Here, the rotation driving unit 172 may include a connection unit (or connector) 172*a* connected to the sensor unit 171 and a rotational force generating unit (or rotational force generator) 172*b* connected to the connection unit 172*a* and rotating the connection unit 172*a*. The connection unit 172*a* may be formed to have a shape of a bar, and the rotational force generating unit 172*b* may include a decelerator connected to the connection unit 172*a* and a motor connected to the decelerator. Here, the rotational force generating unit 172*b* is not limited thereto, and may include all devices and structures connected to the connection unit 172*a* and rotating the connection unit 172*a*.

The sensor heating unit 173 may be arranged to face the sensor unit 171 and may heat the sensor unit 171. Here, the sensor heating unit 173 may include a heater applying heat. According to another embodiment, the sensor heating unit 173 may include a lamp arranged to face the sensor unit 171 and heating the sensor unit 171 by providing light energy to the sensor unit 171.

The first pressure adjusting unit (or first pressure adjustor) 180 may be connected to the chamber 110 and may adjust pressure in the chamber 110. Here, the first pressure adjusting unit 180 may include a first connection pipe 181 connected to the chamber 110 and a first vacuum pump 182 arranged in the first connection pipe 181. In this case, the first connection pipe 181 may be connected to an additional device capable of performing a process of removing external contamination materials.

The source chamber unit 191 may have a space formed therein, and the source unit 130 may be arranged in the source chamber unit 191. Here, the source chamber unit 191 may be further provided, in addition to the chamber 110, and may form a separate space from the chamber 110.

The source chamber unit 191 may include a first source chamber 191*a* in which the first source unit 131 is arranged and a second source chamber 191*b* in which the second source unit 132 is arranged. Here, the first source chamber 191*a* and the second source chamber 191*b* may be separated from each other and may form separate spaces. In this case, even when at least one of the plurality of first source units 131 is broken, the first deposition material in the first source unit 131 may exist in the first source chamber 191*a* and may be prevented from being discharged to the outside of the first source chamber 191*a*. Also, even when at least one of the plurality of second source units 132 is broken, the second deposition material may be prevented from being discharged to the outside via the second source chamber 191*b*.

The second pressure adjusting unit 192 may be connected to the first source chamber 191*a*. The second pressure adjusting unit 192 may include the second connection pipe 192*a* connected to the first source chamber 191*a* and a second vacuum pump 192*b* arranged in the second connection pipe 192*a*.

The third pressure adjusting unit 193 may be connected to the second source chamber 191*b*. The third pressure adjusting unit 193 may include a third connection pipe 193*a* connected to the second source chamber 191*b* and a third vacuum pump 193*b* arranged in the third connection pipe 193*a*. Here, the second pressure adjusting unit 192 and the third pressure adjusting unit 193 may separately operate from each other. In this case, the second pressure adjusting unit 192 and the third pressure adjusting unit 193 may be connected to an additional device for removing contamination materials, which is arranged outside the chamber 110.

The vision unit 194 may be arranged in the chamber 110 and may capture locations of the display substrate D and the mask assembly 123. The display substrate D and the mask assembly 123 may be aligned with respect to each other based on the locations of the display substrate D and the mask assembly 123, the locations being captured by the vision unit 194.

Meanwhile, according to some example embodiments of the method of manufacturing the display apparatus by using the apparatus 100 for manufacturing the display apparatus, the display substrate D and the mask assembly 123 may be inserted into the chamber 110. Here, the first pressure adjusting unit 180 may maintain a pressure in the chamber 110 as the same or substantially the same as air pressure.

Thereafter, the vision unit 194 may capture an align mark of the display substrate D and an align mark of the mask assembly 123 and may align the display substrate D and the mask assembly 123 based on captured results. For example, the location of the mask assembly 123 may be minutely adjusted via the second supporting unit 122.

When the process described above is completed, the source unit 130 may supply the deposition material and deposit the deposition material on the display substrate D. The first source unit 131 and the second source unit 132 may sequentially or simultaneously supply the first deposition material and the second deposition material to the first nozzle unit 141 and the second nozzle unit 142 and deposit the first and second deposition materials on the display substrate D. In this case, according to some example embodiments, the first deposition material and the second deposition material may form different layers from each other. According to some example embodiments, the first deposition material and the second deposition material may be deposited on the display substrate D and may form one layer. Hereinafter, for convenience of explanation, descriptions will be given in more detail by focusing on a case in which the first deposition material and the second deposition material form the same layer.

When the first deposition material and the second deposition material are deposited on the display substrate D as described above, the first temperature sensor 196a and the second temperature sensor 196b may measure an inner temperature of one of the plurality of first source units 131 and an inner temperature of one of the plurality of second source units 132, respectively. The measured inner temperature of the first source unit 131 may be compared with a first pre-set temperature that is pre-set as described above. Also, the measured inner temperature of the second source unit 132 may be compared with a second pre-set temperature that is pre-set. Here, the first pre-set temperature and the second pre-set temperature may be the same as each other or different from each other. Hereinafter, for convenience of explanation, descriptions will be given in more detail by focusing on a case in which the first pre-set temperature and the second pre-set temperature are different from each other.

When the measured inner temperature of the first source unit 131 is greater than the first pre-set temperature, the first source unit 131, the inner temperature of which is measured, may be disconnected from the first nozzle unit 141, via the first sub-regulating unit 151a. Here, the first sub-regulating unit 151a may include a solenoid valve. Also, the first supply pipe 195a and the second supply pipe 195b may be interrupted by the first main regulating unit 151b and the second main regulating unit 152b, to stop the deposition process.

Thereafter, the first sub-regulating unit 151a may connect one of the first source units 131 which are not disconnected from the first nozzle unit 141, from among the plurality of first source units 131, with the first nozzle unit 141. Here, the first sub-regulating unit 151a may connect the one of the first source units 131 which are not disconnected from the first nozzle unit 141, the inner temperature of which is within a range of the pre-set temperature, with the first nozzle unit 141. In this case, the first main regulating unit 151b and the second main regulating unit 152b may be open to deposit the deposition material again on the display substrate D.

Comparing an inner temperature of one of the plurality of second source units 132, the inner temperature being measured by the second temperature sensor 196b, with the second pre-set temperature may be controlled similarly as the method described above.

In this case, a time to replace the first source unit 131 and the second source unit 132 may be reduced, and thus, sequential deposition may be possible and the working time may be reduced.

Meanwhile, the first source unit 131 or the second source unit 132, which has run out of the material as described above, may be replaced, without stopping the deposition process. The replacement method may be that the first source unit 131 or the second source unit 132, which stops operating during the deposition process since it has run out of the material, may be withdrawn by opening the first source chamber 191a or the second source chamber 191b, then may be filled with the material, and then may be arranged again in the first source chamber 191a or the second source chamber 191b. Here, the first sub-regulating unit 151a and the second sub-regulating unit 152a may interrupt a portion of the first supply pipe 195a and a portion of the second supply pipe 195b, the portions being connected to the corresponding first source chamber 191a and the second source chamber 191b, respectively.

While the described process is performed, the first pressure adjusting unit 180 may operate to discharge the gas inside the chamber 110 to the outside, thereby maintaining the pressure inside the chamber 110 at a vacuum (or almost a vacuum) state (such that the pressure inside the chamber 110 is less than an external pressure).

The second pressure adjusting unit 192 and the third pressure adjusting unit 193 may discharge the gas inside the first source chamber 191a and the second source chamber 191b, respectively, to the outside. In this case, even when at least one of the plurality of first source chambers 191a is broken, the first deposition material may be prevented from being discharged to the outside of the first source chamber 191a. Also, even when at least one of the plurality of second source chambers 191b is broken, the second deposition material may be prevented from being discharged to the outside of the second source chamber 191b.

When the first source chamber 191a and the second source chamber 191b are open, the second pressure adjusting unit 192 and the third pressure adjusting unit 193 may maintain an inner pressure of the first source chamber 191a and an inner pressure of the second source chamber 191b, respectively, to be similar as the air pressure.

Meanwhile, when the first deposition material and the second deposition material are deposited on the display substrate D as described above, the first deposition material and the second deposition material may be deposited on the first angle restriction plate 161a and the third angle restriction plate 161c. Here, the first heating unit 162a and the second heating unit 162b may heat the first angle restriction plate 161a and the third angle restriction plate 161c to remove the first deposition material and the second deposition material on the first angle restriction plate 161a and the third angle restriction plate 161c.

For example, in the case described above, when the first deposition material and the second deposition material are excessively deposited on the first angle restriction plate 161a and the third angle restriction plate 161c, excessive burden may be applied to the first angle restriction plate 161a and the third angle restriction plate 161c, so that locations of the first angle restriction plate 161a and the third angle restriction plate 161c may be changed. Also, the first deposition material and the second deposition material deposited on the first angle restriction plate 161a and the third angle restriction plate 161c may fall to contaminate the first nozzle unit 141 and the second nozzle unit 142. However, when the first angle restriction plate 161a and the third angle restriction plate 161c are heated by the first heating unit 162a and the second heating unit 162b as described above, the problem described above may be solved. Also, the first deposition material and the second deposition material heated by the first heating unit 162a and the second heating unit 162b may be supplied to the display substrate D to be deposited on the display substrate D, thereby preventing (or reducing) the exhaustion of the material.

While the first deposition material and the second deposition material are deposited on the display substrate D as described above, the sensor unit 171 may measure a speed (for example, a deposition speed) in which the first deposition material and the second deposition material are deposited on the display substrate D and form a layer. Here, the first deposition material and the second deposition material may be deposited on the sensor unit 171, like or almost like a surface of the display substrate D.

In this case, after a certain period of time, the first deposition material and the second deposition material may be deposited on the sensor unit 171 by a certain thickness, and thus, the sensor unit 171 may not measure the speed or may not accurately measure the speed.

In this case, the rotational driving unit 172 may operate to replace the sensor unit 171 as the new sensor unit 171. Here, the sensor unit 171 may be arranged between the display substrate D and the nozzle unit 140, and a measurement portion of the sensor unit 171 may face the nozzle unit 140.

In this case, the sensor heating unit 173 may heat the sensor unit 171 on which the first deposition material and the second deposition material are deposited, to remove the first and second deposition materials from the sensor unit 171. In this case, the sensor unit 171 may not be replaced and may be recycled.

For example, in a related-art system and method, in order to replace a sensor unit, the whole deposition process might have to be stopped and the chamber 110 might have to be opened or the sensor unit might have to be separated from the chamber 110. In this case, in order to stop the chamber 110, the process is stopped and the chamber 110 is maintained as the air pressure, which may require a significant amount of energy and time to re-operate the apparatus 100 for manufacturing the display apparatus. Thus, the manufacturing efficiency of the display apparatus may be deteriorated.

However, when the sensor unit 171 is recyclable as described above, the manufacturing time of the display apparatus may be reduced and the manufacturing efficiency of the display apparatus may be increased.

Accordingly, according to the apparatus 100 for manufacturing the display apparatus and the method of manufacturing the display apparatus, the source unit 130 which has run out of the material during a deposition process may be replaced, without stopping the deposition process, and thus, the manufacturing time may be reduced, and the manufacturing efficiency of the display apparatus may be increased.

According to the apparatus 100 for manufacturing the display apparatus and the method of manufacturing the display apparatus, the source unit 130 may be arranged in the source chamber unit 191, and thus, when the source unit 130 is broken, instances of the deposition material being discharged may be prevented (or reduced).

According to the apparatus 100 for manufacturing the display apparatus and the method of manufacturing the display apparatus, the deposition material deposited on the angle restriction unit 161 may be removed by using the heating unit 162 and may be guided to the display substrate D, so that wasting of the deposition material may be minimized.

According to the apparatus 100 for manufacturing the display apparatus and the method of manufacturing the display apparatus, the deposition process does not have to be stopped when replacing the sensor unit 171, and thus, the operating time of the apparatus 100 for manufacturing the display apparatus may be increased.

According to the apparatus 100 for manufacturing the display apparatus and the method of manufacturing the display apparatus, the deposition process may be performed by replacing the source unit 130 which has run out of the material with the source unit 130 which has not run out of the material, based on a temperature of each source unit 130.

According to the apparatus 100 for manufacturing the display apparatus and the method of manufacturing the display apparatus, the continual operating time may be increased.

Figure 4:
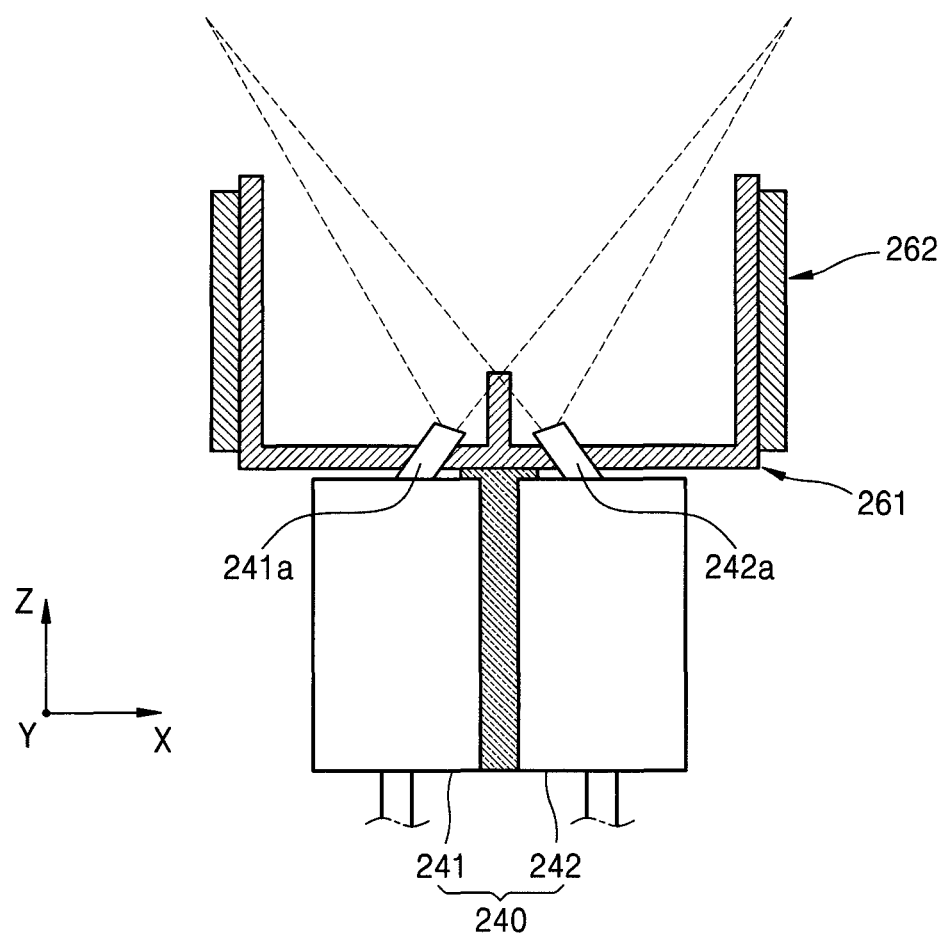
FIG. 4 is a cross-sectional view of a nozzle unit and an angle restriction unit, according to some example embodiments.
Figure 5:
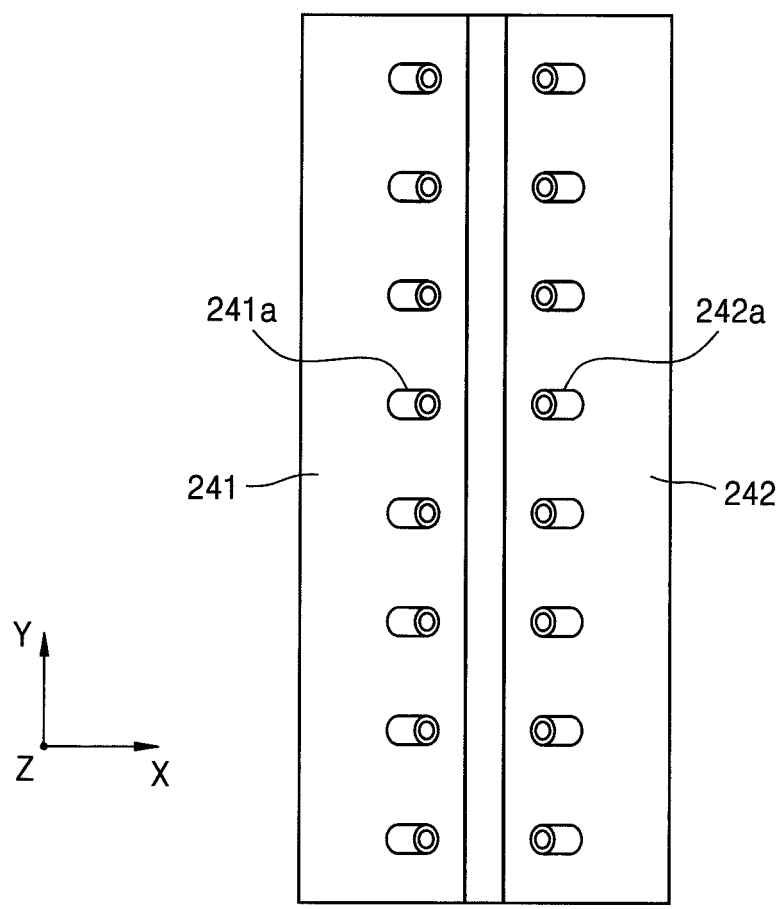
FIG. 5 is a plan view of the nozzle unit illustrated in FIG. 4.

FIG. 4 is a cross-sectional view of a nozzle unit 240 and an angle restriction unit 261, according to some example embodiments. FIG. 5 is a plan view of the nozzle unit 240 illustrated in FIG. 4.

As illustrated in previous figures and referring to FIGS. 4 and 5, an apparatus for manufacturing a display apparatus may include a chamber, a first supporting unit, a second supporting unit, a mask assembly, a source unit, the nozzle unit 240, a regulating unit, the angle restriction unit 261, a heating unit 262, a sensor unit, a rotation driving unit, a sensor heating unit, a first pressure adjusting unit, a source chamber unit, a second pressure adjusting unit, a third pressure adjusting unit, and a vision unit. Here, the chamber, the first supporting unit, the second supporting unit, the mask assembly, the source unit, the regulating unit, the sensor unit, the rotation driving unit, the sensor heating unit, the first pressure adjusting unit, the source chamber unit, the second pressure adjusting unit, the third pressure adjusting unit, and the vision unit may be the same or substantially the same as described above, and thus, certain repetitive descriptions will not be repeated.

The nozzle unit 240 may include a first nozzle unit 241 and a second nozzle unit 242. Here, the first nozzle unit 241 may include a first nozzle 241a and the second nozzle unit 242 may include a second nozzle 242a. In this case, each of the first nozzle 241a and the second nozzle 242a may be provided in a multiple number, and the plurality of first nozzles 241a may be arranged to be apart from one another in a longitudinal direction (for example, a Y direction of FIG. 4) of the first nozzle unit 241, and the plurality of second nozzles 242a may be arranged to be apart from one another in a longitudinal direction of the second nozzle unit 242. In this case, each of the first nozzles 241a and each of the second nozzles 242a may be arranged to be inclined. For example, the first nozzle 241a may be arranged to be inclined from an upper surface of the first nozzle unit 241 toward the second nozzle unit 242. Also, the second nozzle 242a may be arranged to be inclined from an upper surface of the second nozzle unit 242 toward the first nozzle unit 241. In this case, the first nozzle 241a and the second nozzle 242a may be arranged between the first nozzle unit 241 and the second nozzle unit 242.

The angle restriction unit 261 may be arranged at a side surface of each of the first nozzle unit 241 and the second nozzle unit 242. Here, the angle restriction unit 261 may restrict injection angles of deposition materials injected from the first nozzle 241a and the second nozzle 242a.

The heating unit 262 may be arranged in the angle restriction unit 261 and may remove the deposition material deposited on the angle restriction unit 261, as described above.

A method of manufacturing a display apparatus by using the apparatus for manufacturing the display apparatus is the same or substantially the same as described above, and thus, hereinafter, for convenience of explanation, some repetitive description will be omitted.

When the first nozzle 241a and the second nozzle 242a are arranged as described above, a first deposition material injected from the first nozzle 241a and a second deposition material injected from the second nozzle 242a may overlap each other in an injection range of the deposition material of each of the first and second nozzles 241a and 242a, and thus, it is possible to maintain a uniform concentration of the first deposition material and the second deposition material in the whole area of a display substrate.

According to the apparatus for manufacturing the display apparatus and the method of manufacturing the display apparatus, precise deposition may be possible to increase the quality of the display apparatus.

According to the apparatus for manufacturing the display apparatus and the method of manufacturing the display apparatus, wasting of the deposition material may be reduced or minimized, and sequential deposition may be possible.

Figure 6:
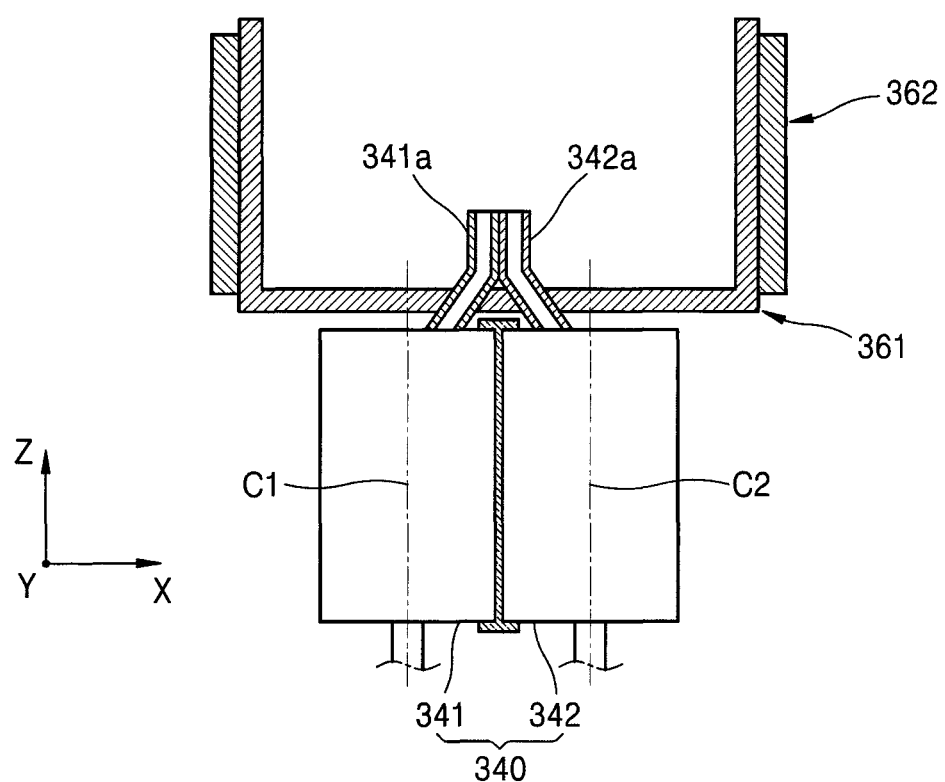
FIG. 6 is a cross-sectional view of a nozzle unit and an angle restriction unit, according to some example embodiments.
Figure 7:
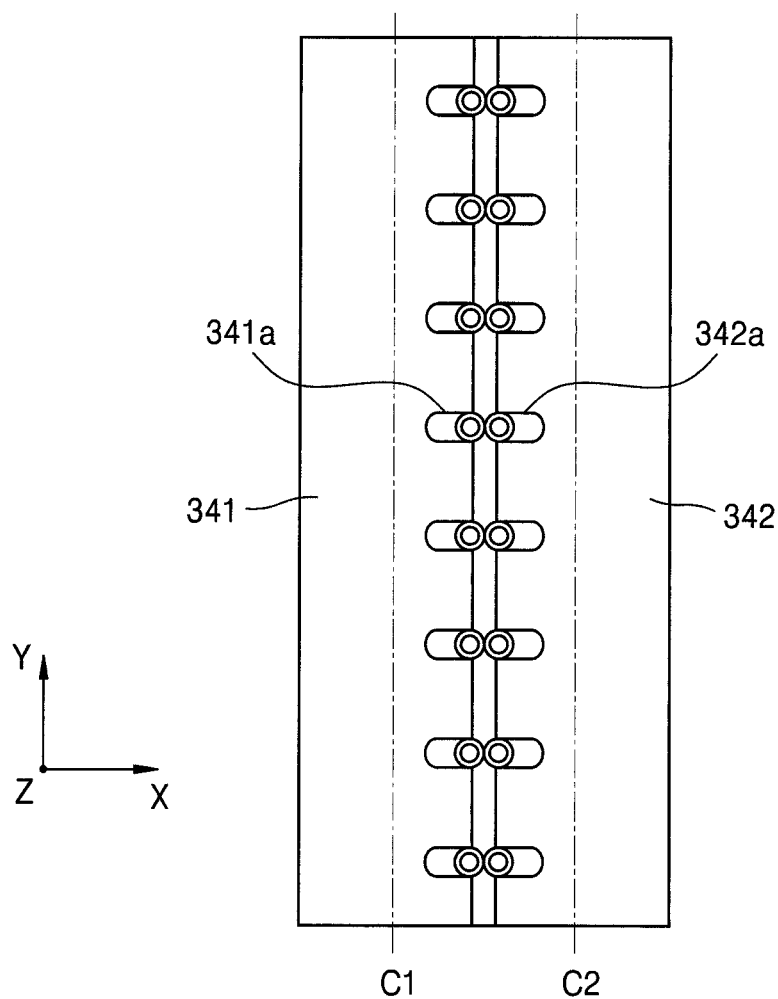
FIG. 7 is a plan view of the nozzle unit illustrated in FIG. 6.

FIG. 6 is a cross-sectional view of a nozzle unit 340 and an angle restriction unit 361, according to some example embodiments. FIG. 7 is a plan view of the nozzle unit 340 illustrated in FIG. 6.

As illustrated previously, and referring to FIGS. 6 and 7, an apparatus for manufacturing a display apparatus may include a chamber, a first supporting unit, a second supporting unit, a mask assembly, a source unit, the nozzle unit 340, a regulating unit, the angle restriction unit 361, a heating unit 362, a sensor unit, a rotation driving unit, a sensor heating unit, a first pressure adjusting unit, a source chamber unit, a second pressure adjusting unit, a third pressure adjusting unit, and a vision unit. Here, the chamber, the first supporting unit, the second supporting unit, the mask assembly, the source unit, the regulating unit, the sensor unit, the rotation driving unit, the sensor heating unit, the first pressure adjusting unit, the source chamber unit, the second pressure adjusting unit, the third pressure adjusting unit, and the vision unit may be the same or substantially the same as described above, and thus, they will not be described in more detail.

A first nozzle unit 341 and a second nozzle unit 342 may be arranged to be adjacent to each other, and the first nozzle unit 341 may include a first nozzle 341a injecting a first deposition material and the second nozzle unit 342 may include a second nozzle 342a injecting a second deposition material. In this case, the first nozzle 341a and the second nozzle 342a may be arranged between a first center C1 of the first nozzle unit 341 and a second center C2 of the second nozzle unit 342, as described above with reference to FIGS. 1 through 3. Here, the first nozzle 341a and the second nozzle 342a may be at least partially connected to each other. A portion of the first nozzle 341a and a portion of the second nozzle 342a, in which the first nozzle 341a and the second nozzle 342a are connected to each other, may be apart from each other.

In this case, the first nozzle 341a and the second nozzle 342a may be connected to each other and may be arranged between the first nozzle unit 341 and the second nozzle unit 342. In this case, an area in which the first deposition material injected from the first nozzle 341a and the second deposition material injected from the second nozzle 342a may not overlap each other may be minimized.

The angle restriction unit 361 may be arranged at a side surface of each of the first nozzle unit 341 and the second nozzle unit 342. Here, the angle restriction unit 361 may restrict injection angles of the first and second deposition materials injected from the first nozzle 341a and the second nozzle 342a.

The heating unit 362 may be arranged in the angle restriction unit 361 as described above and may remove the deposition material deposited on the angle restriction unit 361.

Meanwhile, a method of manufacturing a display apparatus by using the apparatus for manufacturing the display apparatus is the same or substantially the same as described above, and thus, hereinafter, for convenience of explanation, some repetitive description will be omitted.

When the first nozzle 341a and the second nozzle 342a are arranged as described above, the first deposition material injected from the first nozzle 341a and the second deposition material injected from the second nozzle 342a may overlap each other in an injection range of the deposition material of each of the first and second nozzles 341a and 342a, and thus, it is possible to maintain a uniform concentration of the first deposition material and the second deposition material in the whole area of a display substrate.

According to the apparatus for manufacturing the display apparatus and the method of manufacturing the display apparatus, precise deposition may be possible to increase the quality of the display apparatus.

According to the apparatus for manufacturing the display apparatus and the method of manufacturing the display apparatus, wasting of the deposition material may be minimized, and sequential deposition may be possible.

Figure 8:
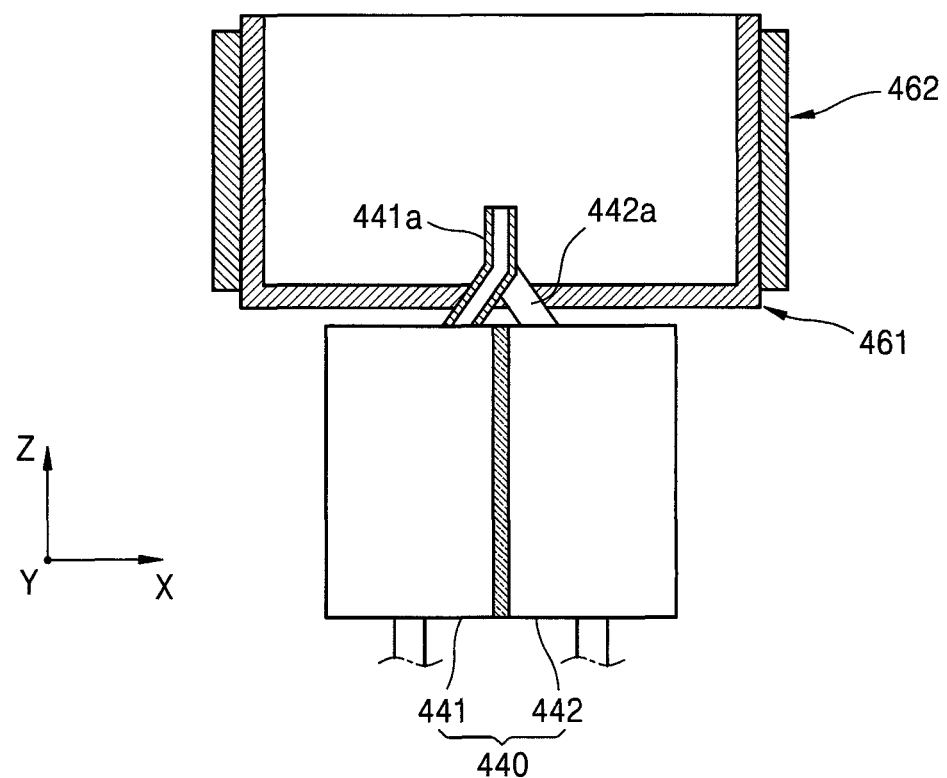
FIG. 8 is a cross-sectional view of a nozzle unit and an angle restriction unit, according to some example embodiments.
Figure 9:
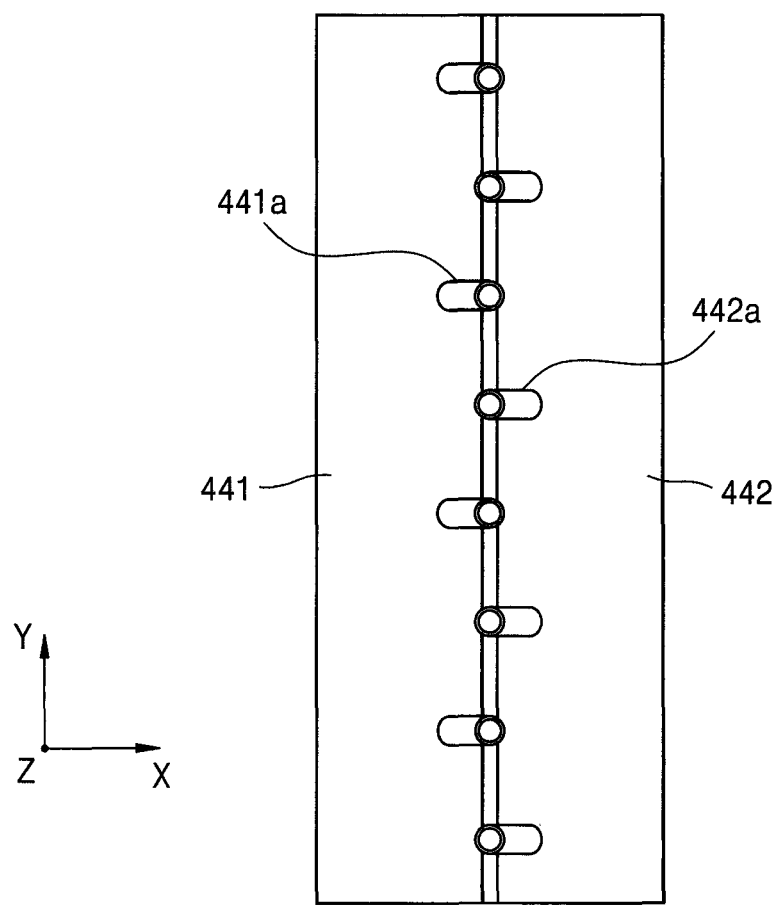
FIG. 9 is a plan view of the nozzle unit illustrated in FIG. 8.

FIG. 8 is a cross-sectional view of a nozzle unit 440 and an angle restriction unit 461, according to some example embodiments. FIG. 9 is a plan view of the nozzle unit 440 illustrated in FIG. 8.

As described previously, and referring to FIGS. 8 and 9, an apparatus for manufacturing a display apparatus may include a chamber, a first supporting unit, a second supporting unit, a mask assembly, a source unit, the nozzle unit 440, a regulating unit, the angle restriction unit 461, a heating unit 462, a sensor unit, a rotation driving unit, a sensor heating unit, a first pressure adjusting unit, a source chamber unit, a second pressure adjusting unit, a third pressure adjusting unit, and a vision unit. Here, the chamber, the first supporting unit, the second supporting unit, the mask assembly, the source unit, the regulating unit, the sensor unit, the rotation driving unit, the sensor heating unit, the first pressure adjusting unit, the source chamber unit, the second pressure adjusting unit, the third pressure adjusting unit, and the vision unit may be the same or substantially the same as described above, and thus, some repetitive description will be omitted for brevity.

A first nozzle unit 441 may include a first nozzle 441a guiding a first deposition material and a second nozzle unit 442 may include a second nozzle 442a guiding a second deposition material. Here, the first nozzle 441a and the second nozzle 442a may be formed to be the same or substantially the same as each other, and thus, descriptions will be given in more detail by focusing on the first nozzle 441a.

The first nozzle 441a may be bent from the first nozzle unit 441 toward the second nozzle unit 442. Here, a portion of the first nozzle unit 441 may be inclined, and the other portion of the first nozzle unit 441 may be straight. Here, an end of the first nozzle unit 441 may be arranged between the first nozzle unit 441 and the second nozzle unit 442.

The first nozzle 441a and the second nozzle 442a may be arranged in series. Here, each of the first nozzle 441a and the second nozzle 442a may be provided in a multiple number, and the plurality of first nozzles 441a and the plurality of second nozzles 442a may be arranged to be apart from each other in a longitudinal direction of the first nozzle unit 441. Also, the first nozzle 441a and the second nozzle 442a may be adjacent to each other. For example, the first nozzle 441a and the second nozzle 442a may be connected to each other in the longitudinal direction of the first nozzle unit 441 and may form a group. This group may be provided in a multiple number, and the plurality of groups may be arranged to be apart from each other in the longitudinal direction of the first nozzle unit 441 as described above. In this case, the first deposition material injected from the first nozzle 441a and the second deposition material injected from the second nozzle 442a may overlap each other in a widest range as possible and may be supplied to a display substrate.

The angle restriction unit 461 may be arranged at a side surface of each of the first nozzle unit 441 and the second nozzle unit 442. Here, the angle restriction unit 461 may restrict injection angles of the first and second deposition materials injected from the first nozzle 441a and the second nozzle 442a.

The heating unit 462 may be arranged in the angle restriction unit 461 and may remove the deposition material deposited on the angle restriction unit 461, as described above.

Meanwhile, a method of manufacturing a display apparatus by using the apparatus for manufacturing the display apparatus as described above may be the same or substantially the same as described above, and thus, some repetitive description will be omitted for brevity.

When the first nozzle 441a and the second nozzle 442a are arranged as described above, the first deposition material injected from the first nozzle 441a and the second deposition material injected from the second nozzle 442a may overlap each other in an injection range of the deposition material of each of the first and second nozzles 441a and 442a, and thus, it is possible to maintain a uniform concentration of the first deposition material and the second deposition material in the whole area of a display substrate.

According to the apparatus for manufacturing the display apparatus and the method of manufacturing the display apparatus, precise deposition may be possible to increase the quality of the display apparatus.

According to the apparatus for manufacturing the display apparatus and the method of manufacturing the display apparatus, wasting of the deposition material may be minimized and sequential deposition may be possible.

Figure 10:
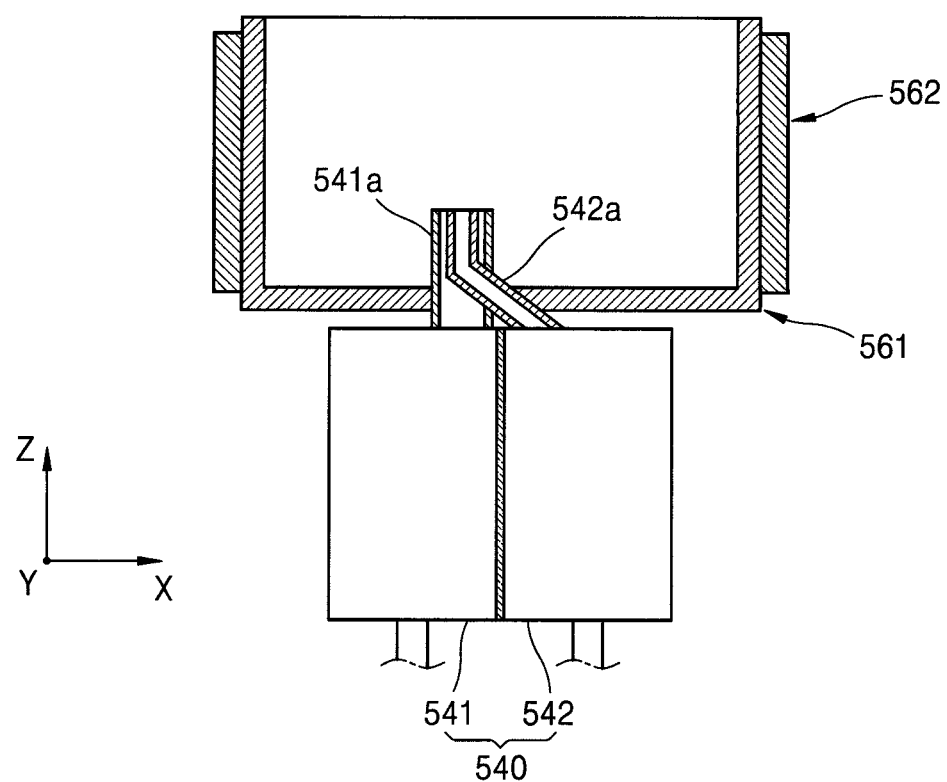
FIG. 10 is a cross-sectional view of a nozzle unit and an angle restriction unit, according to some example embodiments.
Figure 11:
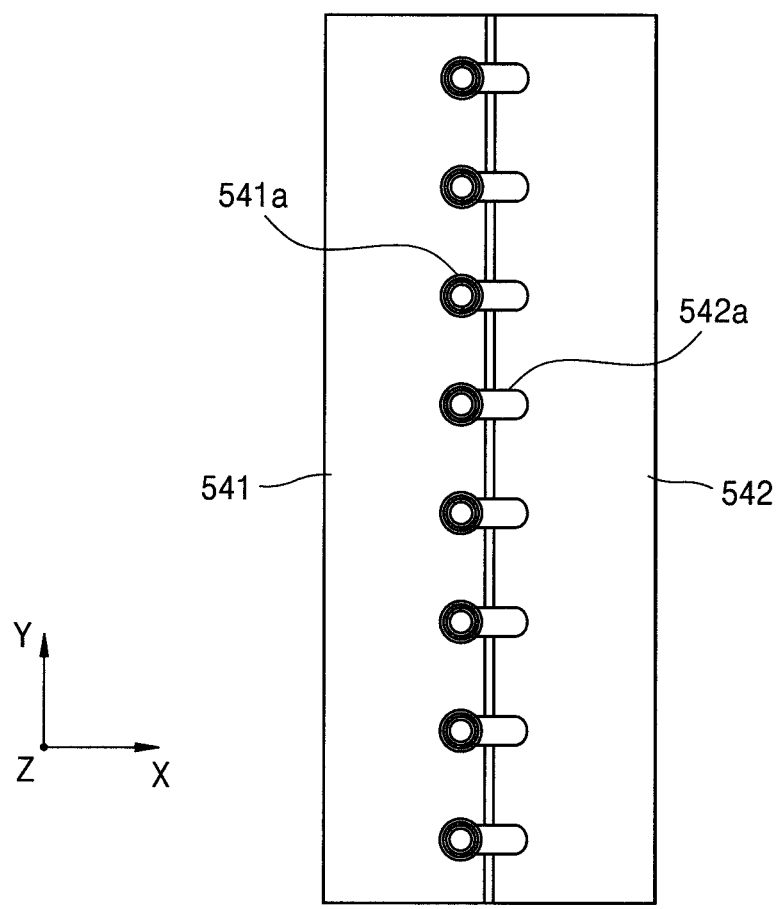
FIG. 11 is a plan view of the nozzle unit illustrated in FIG. 10.

FIG. 10 is a cross-sectional view of a nozzle unit 540 and an angle restriction unit 561, according to some example embodiments. FIG. 11 is a plan view of the nozzle unit 540 illustrated in FIG. 10.

As described previously and referring to FIGS. 10 and 11, an apparatus for manufacturing a display apparatus may include a chamber, a first supporting unit, a second supporting unit, a mask assembly, a source unit, the nozzle unit 540, a regulating unit, the angle restriction unit 561, a heating unit 562, a sensor unit, a rotation driving unit, a sensor heating unit, a first pressure adjusting unit, a source chamber unit, a second pressure adjusting unit, a third pressure adjusting unit, and a vision unit. Here, the chamber, the first supporting unit, the second supporting unit, the mask assembly, the source unit, the regulating unit, the sensor unit, the rotation driving unit, the sensor heating unit, the first pressure adjusting unit, the source chamber unit, the second pressure adjusting unit, the third pressure adjusting unit, and the vision unit may be the same or substantially the same as described above, and thus, some repetitive description will be omitted for brevity.

A first nozzle unit 541 may include a first nozzle 541a guiding a first deposition material and a second nozzle unit 542 may include a second nozzle 542a guiding a second deposition material. Here, one of the first nozzle 541a and the second nozzle 542a may be arranged in the other of the first nozzle 541a and the second nozzle 542a. In this case, an outlet of the first nozzle 541a and an outlet of the second nozzle 542a may be formed as a circular shape, and the outlet of the first nozzle 541a and the outlet of the second nozzle 542a may be the same as each other. Hereinafter, for convenience of explanation, descriptions will be given in more detail by focusing on a case in which the second nozzle 542a is arranged in the first nozzle 541a.

In this case, when the deposition material is deposited on a display substrate, an injection range of the second deposition material injected from the second nozzle 542a may overlap an injection range of the first deposition material injected from the first nozzle 541a. In this case, an area in which the first deposition material and the second deposition material may not overlap each other may be minimized.

The angle restriction unit 561 may be arranged at a side surface of each of the first nozzle unit 541 and the second nozzle unit 542. Here, the angle restriction unit 561 may restrict injection angles of the deposition materials injected from the first nozzle 541a and the second nozzle 542a.

The heating unit 562 may be arranged in the angle restriction unit 561 and may remove the deposition material deposited on the angle restriction unit 561, as described above.

Meanwhile, a method of manufacturing a display apparatus by using the apparatus for manufacturing the display apparatus is the same or substantially the same as described above, and thus, hereinafter, for convenience of explanation, some repetitive description will be omitted.

When the first nozzle 541a and the second nozzle 542a are arranged as described above, the first deposition material injected from the first nozzle 541a and the second deposition material injected from the second nozzle 542a may overlap each other in an injection range of the deposition material of each of the first and second nozzles 541a and 542a, and thus, it is possible to maintain a uniform concentration of the first deposition material and the second deposition material in the whole area of a display substrate.

According to the apparatus for manufacturing the display apparatus and the method of manufacturing the display apparatus, precise deposition may be possible to increase the quality of the display apparatus.

According to the apparatus for manufacturing the display apparatus and the method of manufacturing the display apparatus, wasting of the deposition material may be minimized and sequential deposition may be possible.

Figure 12:
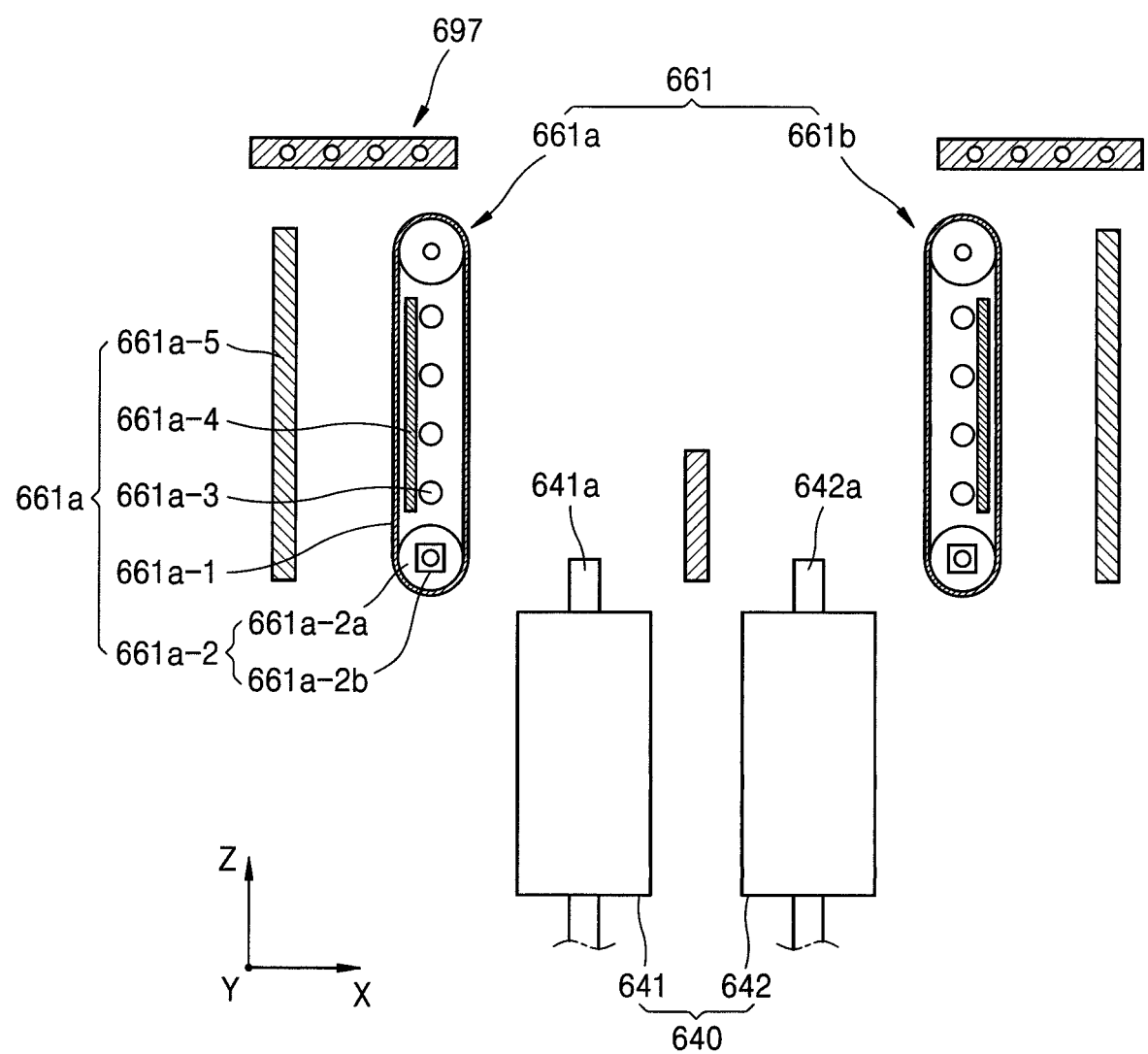
FIG. 12 is a cross-sectional view of a portion of an apparatus for manufacturing a display apparatus, according to some example embodiments.

FIG. 12 is a cross-sectional view of a portion of an apparatus for manufacturing a display apparatus, according to another embodiment.

As described previously, and referring to FIG. 12, the apparatus for manufacturing the display apparatus may include a chamber, a first supporting unit, a second supporting unit, a mask assembly, a source unit, a nozzle unit 640, a regulating unit, an angle restriction unit 661, a sensor unit, a rotation driving unit, a sensor heating unit, a first pressure adjusting unit, a source chamber unit, a second pressure adjusting unit, a third pressure adjusting unit, a vision unit, and a deposition material collecting unit (or deposition material collector) 697. Here, the chamber, the first supporting unit, the second supporting unit, the mask assembly, the source unit, the regulating unit, the sensor unit, the rotation driving unit, the sensor heating unit, the first pressure adjusting unit, the source chamber unit, the second pressure adjusting unit, the third pressure adjusting unit, and the vision unit may be the same or substantially the same as described above, and thus, some repetitive description will be omitted for brevity.

The nozzle unit 640 may be formed to have the same or substantially the same shape as described above with reference to FIGS. 1 through 11. The nozzle unit 640 may include a first nozzle unit 641 and a second nozzle unit 642, and the first nozzle unit 641 may include a first nozzle 641*a* injecting a first deposition material and the second nozzle unit 642 may include a second nozzle 642*a* injecting a second deposition material.

The angle restriction unit 661 may include a first angle restriction unit 661*a* arranged at a side of the first nozzle unit 641 and a second angle restriction unit 661*b* arranged at a side of the second nozzle unit 642. Here, the first angle restriction unit 661*a* and the second angle restriction unit 661*b* may be arranged to face each other. In this case, the first nozzle 641*a* and the second nozzle 642*a* may be arranged between the first angle restriction unit 661*a* and the second angle restriction unit 661*b*. In this case, the first angle restriction unit 661*a* and the second angle restriction unit 661*b* may be formed to be the same or substantially the same as each other, and thus, hereinafter, for convenience of explanation, descriptions will be given in more detail by focusing on the first angle restriction unit 661*a*.

The first angle restriction unit 661*a* may include a first angle restriction belt 661*a*-1, a first belt driving unit 661*a*-2, a first belt cooling unit 661*a*-3, a first insulating unit 661*a*-4, and a first belt heating unit 661*a*-5. The first angle restriction belt 661*a*-1 may be a belt having a loop shape. Here, the first angle restriction belt 661*a*-1 may be formed to have a shape of a closed loop. Also, the first angle restriction belt 661*a*-1 may completely close a side surface of the first nozzle unit 641 in a longitudinal direction (for example, a Y direction of FIG. 12) of the first nozzle unit 641. The first belt driving unit 661*a*-2 may be connected to the first angle restriction belt 661*a*-1 and may rotate the first angle restriction belt 661*a*-1.

Here, the first belt driving unit 661*a*-2 may include a plurality of first rollers 661*a*-2*a* rotating in contact with the first angle restriction belt 661*a*-1 and a first motor 661*a*-2*b* connected to at least one of the plurality of first rollers 661*a*-2*a* and rotating the first roller 661*a*-2*a*. The first belt cooling unit 661*a*-3 may cool a surface of the first angle restriction belt 661*a*-1. In this case, a refrigerant may be circulated in the first belt cooling unit 661*a*-3. Based on the circulation of the refrigerant, a temperature of the surface of the first angle restriction belt 661*a*-1 may descend. Here, the cooled surface of the first angle restriction belt 661*a*-1 may be arranged at a side of the first nozzle unit 641.

The first insulating unit 661*a*-4 may be arranged between the first belt cooling unit 661*a*-3 and the first angle restriction belt 661*a*-1. In this case, the first insulating unit 661*a*-4 may include an insulating member and may prevent a temperature of the first angle restriction belt 661*a*-1 from descending due to the first belt cooling unit 661*a*-3. Here, the first insulating unit 661*a*-4 may be arranged to face the first belt heating unit 661*a*-5. Also, the first insulating unit 661*a*-4 may be formed to have various shapes. According to an embodiment, the first insulating unit 661*a*-4 may be formed to have a shape of a plate. According to another embodiment, the first insulating unit 661*a*-4 may be formed to have a shape of a cap and may be arranged to surround a portion of the first belt cooling unit 661*a*-3. That is, the first insulating unit 661*a*-4 may be formed to have an open portion and the first belt cooling unit 661*a*-3 may be arranged in the first insulating unit 661*a*-4. Here, the open portion of the first insulating unit 661*a*-4 may be toward the first nozzle unit 641. The first belt heating unit 661*a*-5 may heat the first angle restriction belt 661*a*-1 and remove the deposition material attached to the first angle restriction belt 661*a*-1. In this case, the first belt heating unit 661*a*-5 may include a heater supplying heat energy to the first angle restriction belt 661*a*-1 or a lamp supplying light energy to the first angle restriction belt 661*a*-1.

With respect to an operation of the first angle restriction unit 661*a*, when the deposition is performed, the first angle restriction unit 661*a* may restrict angles of the first and second deposition materials injected from the first nozzle 641*a* and the second nozzle 642*a*. In this case, a surface of the first angle restriction belt 661*a*-1 may deposit the deposition materials injected from the first nozzle 641*a* and the second nozzle 642*a*. Here, the first nozzle 641*a* and the second nozzle 642*a* may be arranged as described above with reference to FIGS. 1 through 11.

In this case, the first belt cooling unit 661*a*-3 may cool the surface of the first angle restriction belt 661*a*-1 to decrease a temperature of the surface of the first angle restriction belt 661*a*-1 so that the deposition materials may be quickly deposited on the surface of the first angle restriction belt 661*a*-1. Also, the first insulating unit 661*a*-4 may prevent a portion except the surface of the first angle restriction belt 661*a*-1 from being cooled, the surface being cooled by the first belt cooling unit 661*a*-3.

After a certain period of time passes while the deposition is continually performed, when the first motor 661*a*-2*b* operates and rotates at least one of the plurality of first rollers 661*a*-2*a*, the first angle restriction belt 661*a*-1 may rotate. Here, the surface of the first angle restriction belt 661*a*-1, the surface on which the deposition materials are deposited, may face the first belt heating unit 661*a*-5, and another portion of the first angle restriction belt 661*a*-1 may be arranged in the first nozzle unit 641. In this case, the deposition materials injected from the first nozzle unit 641 and the second nozzle unit 642 may be deposited on the other portion of the first angle restriction belt 661*a*-1. While this process is performed, the first belt heating unit 661*a*-5 may apply heat to the surface of the first angle restriction belt 661*a*-1 to remove the deposition materials from the surface of the first angle restriction belt 661*a*-1.

Meanwhile, the deposition material collecting unit 697 may be arranged above the angle restriction unit 661. For example, the deposition material collecting unit 697 may collect the deposition materials removed from the angle restriction unit 661. In this case, the deposition material collecting unit 697 may include a collecting plate 697a collecting the deposition materials and a plate cooling unit 697b decreasing a temperature of the collecting plate 697a. Here, the plate cooling unit 697b may be arranged in the collecting plate 697a and a refrigerant may circulate in the plate cooling unit 697b.

When the deposition materials removed from the angle restriction unit 661 are moved in the chamber, the deposition materials may collide with the collecting plate 697a. Here, a surface temperature of the collecting plate 697a may be maintained to be lower than a temperature inside the chamber 610, via the plate cooling unit 697b. In this case, the deposition materials may be deposited on the collecting plate 697a.

With respect to an operation of the apparatus for manufacturing the display apparatus described above, a method of manufacturing a display apparatus by using the apparatus for manufacturing the display apparatus is the same or substantially the same as described above, and thus, hereinafter, for convenience of explanation, some repetitive description will be omitted. Here, the angle restriction unit 661 and the deposition material collecting unit 697 may remove the deposition materials as described above.

Thus, according to the apparatus for manufacturing the display apparatus and the method of manufacturing the display apparatus, the deposition materials which are incident into the display substrate D by a less angle via the angle restriction unit 661 may be effectively removed. Also, according to the apparatus for manufacturing the display apparatus and the method of manufacturing the display apparatus, the angle restriction unit 661 may be continually used in the deposition process, and thus, the apparatus for manufacturing the display apparatus may not stop operating and may be continually used.

According to the apparatus for manufacturing the display apparatus and the method of manufacturing the display apparatus, precise deposition may be possible to increase the quality of the display apparatus.

According to the apparatus for manufacturing the display apparatus and the method of manufacturing the display apparatus, wasting of the deposition material may be minimized, and sequential deposition may be possible.

Figure 13:
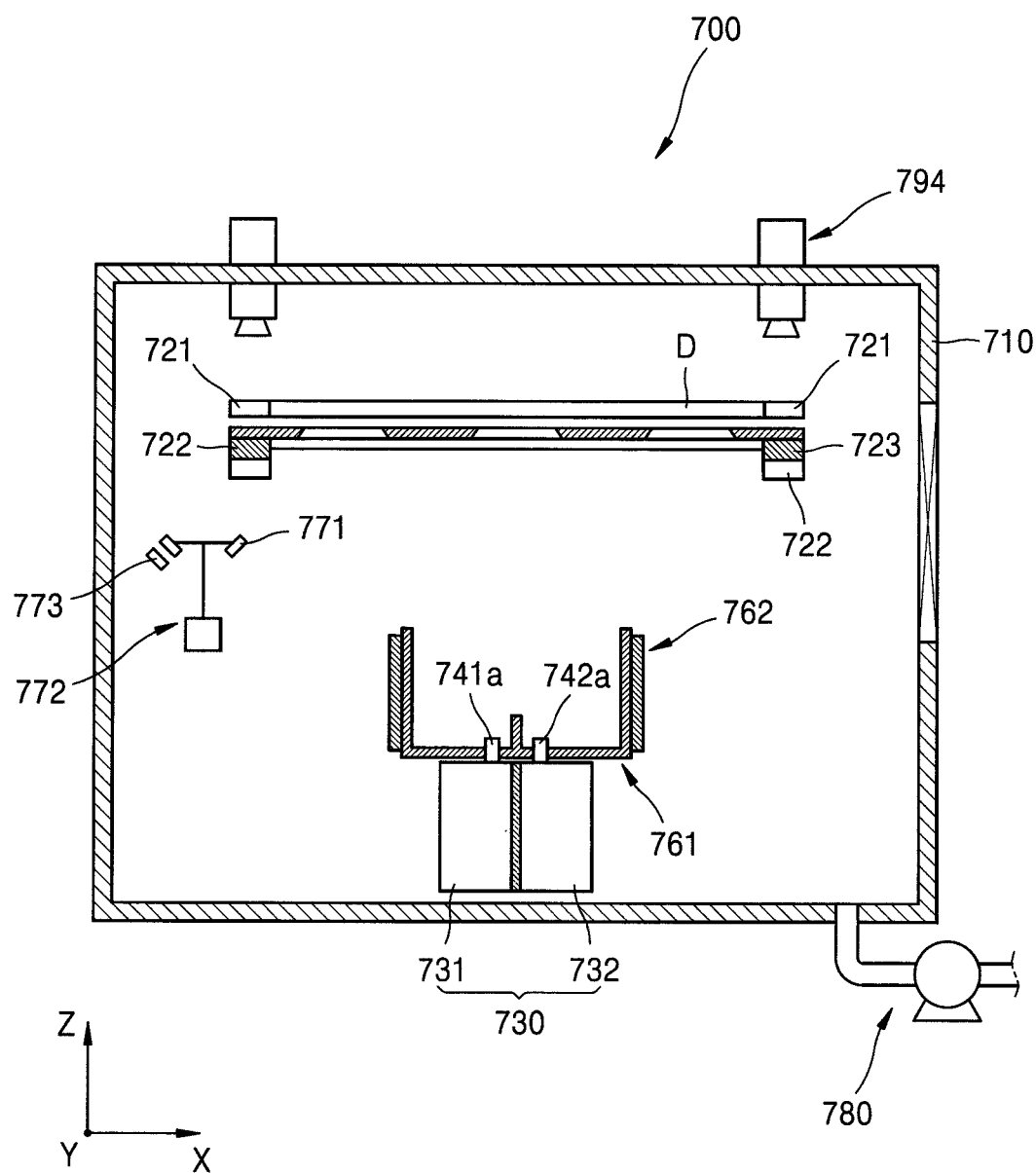
FIG. 13 is a cross-sectional view of an apparatus for manufacturing a display apparatus, according to some example embodiments.

FIG. 13 is a cross-sectional view of an apparatus 700 for manufacturing a display apparatus, according to some example embodiments.

Referring to FIG. 13, the apparatus 700 for manufacturing the display apparatus may include a chamber 710, a first supporting unit 721, a second supporting unit 722, a mask assembly 723, a source unit 730, an angle restriction unit 761, a heating unit 762, a sensor unit 771, a rotation driving unit 772, a sensor heating unit 773, a first pressure adjusting unit 780, and a vision unit 794. Here, the chamber 710, the first supporting unit 721, the second supporting unit 722, the mask assembly 723, the angle restriction unit 761, the heating unit 762, the sensor unit 771, the rotation driving unit 772, the sensor heating unit 773, the first pressure adjusting unit 780, and the vision unit 794 may be the same or substantially the same as described above with reference to FIGS. 1 through 3, and thus, some repetitive description will be omitted.

The source unit 730 may include a nozzle unit. That is, the source unit 730 may accommodate a deposition material and may evaporate or sublimate the deposition material to supply the deposition material into the chamber 710. In this case, the source unit 730 may include a first source unit 731 and a second source unit 732. Here, the first source unit 731 may accommodate a first deposition material and supply the first deposition material to the chamber 710 and the second source unit 732 may accommodate a second deposition material and supply the second deposition material to the chamber 710. In this case, the first source unit 731 may include a first nozzle 741a and the second source unit 732 may include a second nozzle 742a. Here, the first nozzle 741a and the second nozzle 742a may be arranged as described above with reference to FIGS. 1 through 11.

Meanwhile, with respect to a method of manufacturing a display apparatus by using the apparatus 700 for manufacturing the display apparatus described above, the mask assembly 723 and the display substrate D may be inserted into the chamber 710. After the mask assembly 723 and the chamber 710 are aligned with each other, the source unit 730 may supply the deposition material and may deposit the deposition material on the display substrate D.

In this case, the angle restriction unit 761 may restrict injection angles of the deposition materials injected from the first nozzle unit 741 and the second nozzle unit 742. Also, the heating unit 762 may heat the angle restriction unit 761 to remove the deposition materials deposited on the angle restriction unit 761.

Meanwhile, while the process is performed, the sensor unit 771 (for example, a first sensor unit) may measure the amount of the deposition material deposited on the display substrate D.

The process described above may be repeatedly performed during a certain period of time. Here, the certain period of time may correspond to the number of deposition processes performed on the display substrate D, and the deposition material may be deposited on a plurality of display substrates D during the certain period of time.

After the certain period of time, the rotation driving unit 772 may operate to replace the sensor unit 771 as the new sensor unit 771 (for example, a second sensor unit). Also, the sensor unit 771 previously used may be arranged to face the sensor heating unit 773, and the sensor heating unit 773 may heat the sensor unit 771 to remove the deposition material deposited on the sensor unit 771.

Accordingly, according to the apparatus 700 for manufacturing the display apparatus and the method of manufacturing the display apparatus, the source unit 730 which has run out of the material during a deposition process may be replaced, without stopping the deposition process, and thus, the manufacturing time may be reduced, and the manufacturing efficiency of the display apparatus may be increased.

According to the apparatus 700 for manufacturing the display apparatus and the method of manufacturing the display apparatus, the deposition material deposited on the angle restriction unit 761 may be removed by using the heating unit 762 and may be guided to the display substrate D, and thus, wasting of the deposition material may be minimized.

According to the apparatus 700 for manufacturing the display apparatus and the method of manufacturing the display apparatus, the deposition process does not have to be stopped when replacing the sensor unit 771, and thus, the operating time of the apparatus 700 for manufacturing the display apparatus may be increased.

According to the apparatus 700 for manufacturing the display apparatus and the method of manufacturing the display apparatus, the deposition process may be performed by replacing the source unit 730 which has run out of the material with the source unit 730 which has not run out of the material, based on a temperature of each source unit 730.

According to the apparatus 700 for manufacturing the display apparatus and the method of manufacturing the display apparatus, the continual operating time may be increased.

Figure 14:
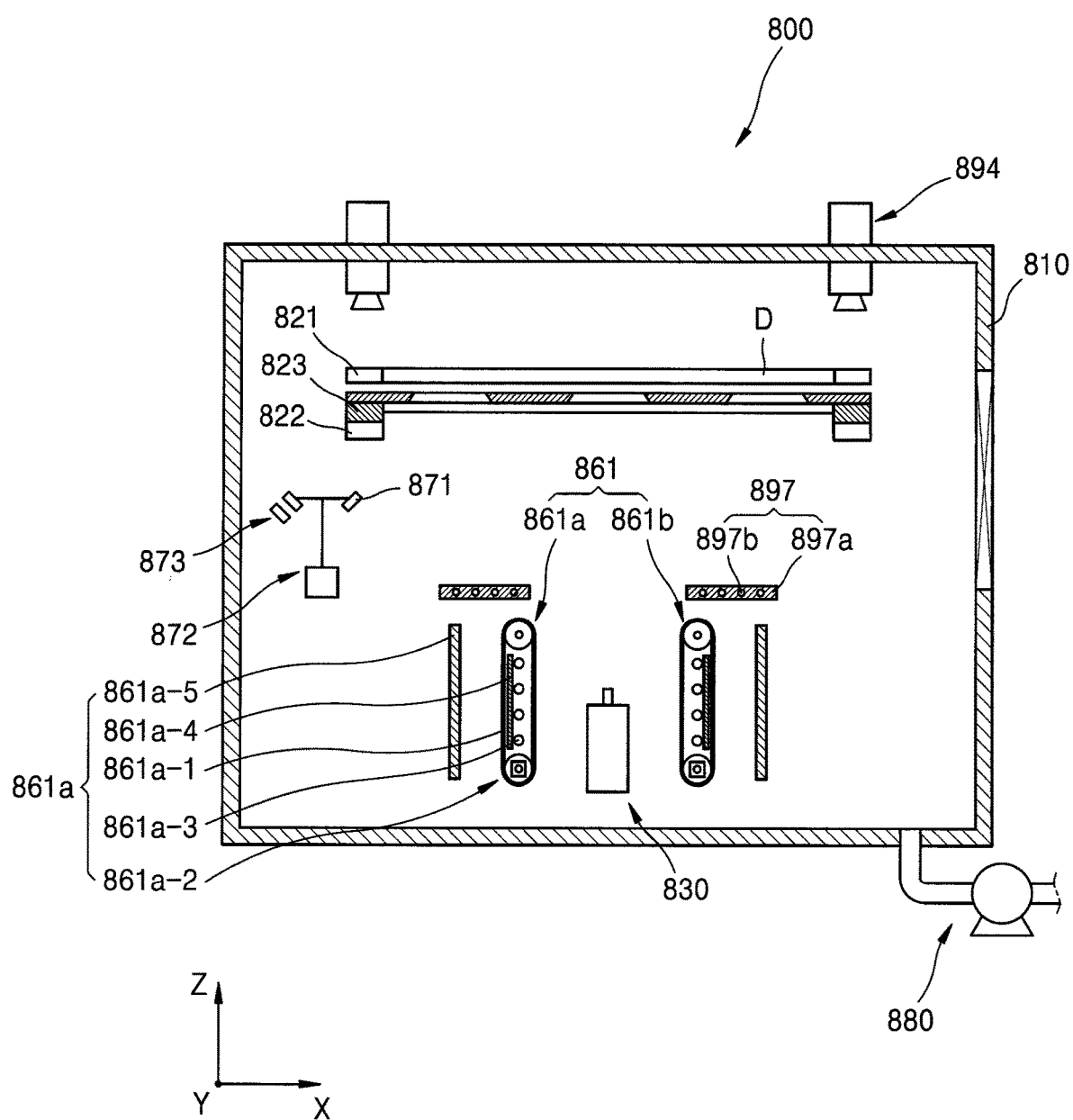
FIG. 14 is a cross-sectional view of an apparatus for manufacturing a display apparatus, according to some example embodiments.

FIG. 14 is a cross-sectional view of an apparatus 800 for manufacturing a display apparatus, according to some example embodiments.

Referring to FIG. 14, the apparatus 800 for manufacturing the display apparatus may include a chamber 810, a first supporting unit 821, a second supporting unit 822, a mask assembly 823, a source unit 830, an angle restriction unit 861, a sensor unit 871, a rotation driving unit 872, a sensor heating unit 873, a first pressure adjusting unit 880, a vision unit 894, and a deposition material collecting unit 897. Here, the chamber 810, the first supporting unit 821, the second supporting unit 822, the mask assembly 823, the sensor unit 871, the rotation driving unit 872, the sensor heating unit 873, the first pressure adjusting unit 880, and the vision unit 894 may be the same or substantially the same as described above with reference to FIGS. 1 through 3, and thus, some repetitive description will be omitted for brevity.

The source unit 830 may be the same or substantially the same as described above with reference to FIG. 13. Here, the source unit 830 may accommodate a deposition material and may evaporate or sublimate the deposition material.

The angle restriction unit 861 may include a first angle restriction unit 861a and a second angle restriction unit 861b. Here, the first angle restriction unit 861a and the second angle restriction unit 861b may be formed to be substantially the same as each other. In this case, the first angle restriction unit 861a may include a first angle restriction belt 861a-1, a first belt cooling unit 861a-3, a first insulating unit 861a-4, and a first belt heating unit 861a-5. Here, the first angle restriction unit 861a and the second angle restriction unit 861b may be the same or substantially the same as described above with reference to FIG. 12, and thus, some repetitive description will be omitted for brevity.

The deposition material collecting unit 897 may include a collecting plate 897a and a plate cooling unit 897b. Here, the deposition material collecting unit 897 may be the same or substantially the same as described above with reference to FIG. 12, and thus, some repetitive description will be omitted.

A method of manufacturing a display apparatus by using the apparatus 800 for manufacturing the display apparatus may be the same or substantially the same as described above.

For example, according to an operation of the source unit 830, the deposition material may pass through the mask assembly 823 and may be deposited on an area of the display substrate D. Here, the angle restriction unit 861 may restrict an angle of the deposition material injected by the source unit 830 and may remove a portion of the deposition material. Also, according to an operation of the angle restriction unit 861, the deposition material deposited on the angle restriction unit 861 may be removed and the removed deposition material may be deposited on the deposition material collecting unit 897.

Also, while the process described above is performed, the sensor unit 871 may monitor the amount of the deposition material deposited on the display substrate D. In addition, after a certain period of time, the sensor unit 871 may be replaced by the new sensor unit 871 to increase the operating time of the apparatus 800 for manufacturing the display apparatus.

Thus, according to the apparatus 800 for manufacturing the display apparatus and the method of manufacturing the display apparatus, precise deposition may be possible to increase the quality of the display apparatus.

According to the apparatus 800 for manufacturing the display apparatus and the method of manufacturing the display apparatus, wasting of the deposition material may be minimized and sequential deposition may be possible.

Figure 15:
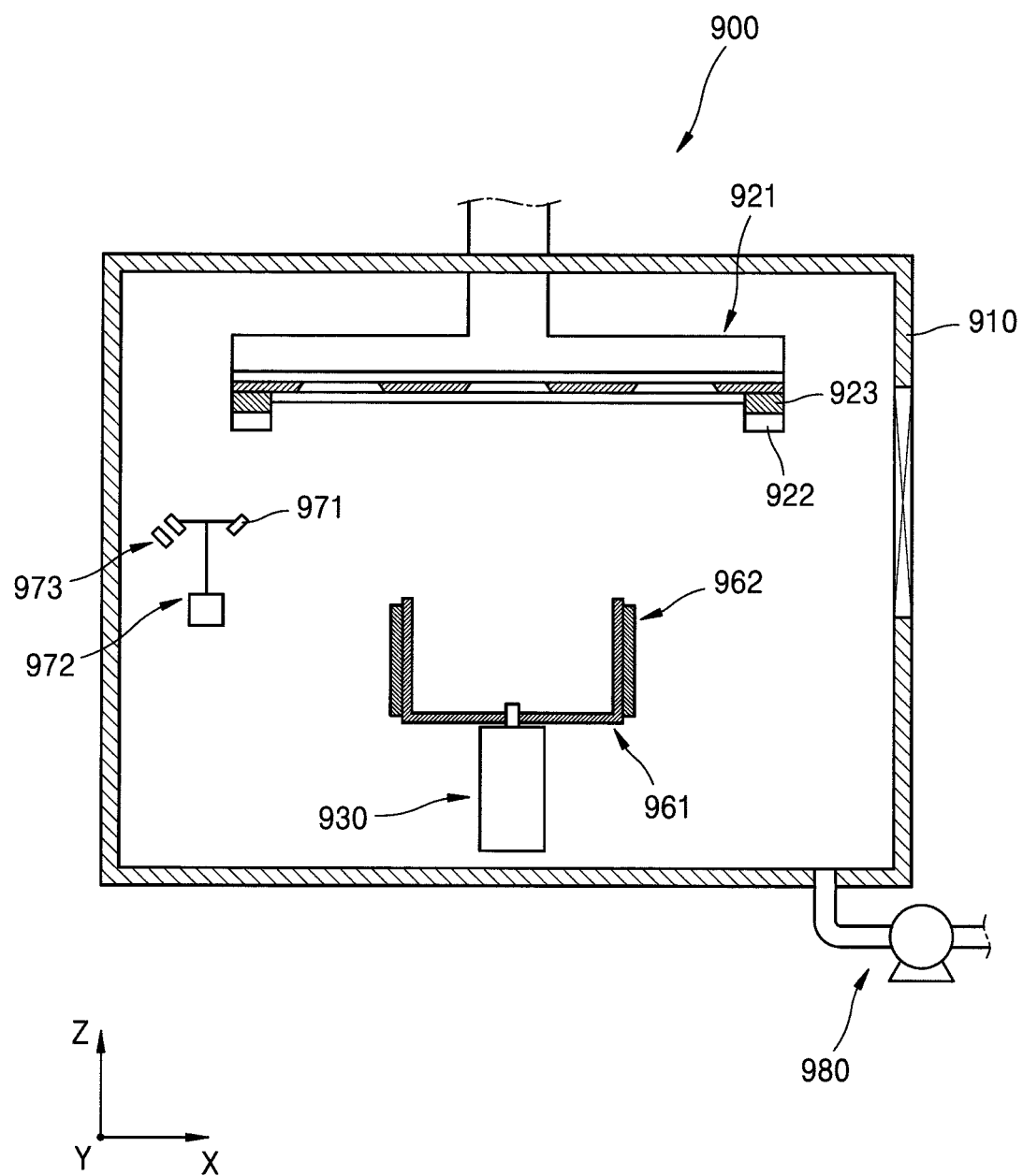
FIG. 15 is a cross-sectional view of an apparatus for manufacturing a display apparatus, according to some example embodiments.

FIG. 15 is a cross-sectional view of an apparatus 900 for manufacturing a display apparatus, according to some example embodiments.

Referring to FIG. 15, the apparatus 900 for manufacturing the display apparatus may include a chamber 910, a first supporting unit 921, a second supporting unit 922, a mask assembly 923, a source unit 930, an angle restriction unit 961, a heating unit 962, a sensor unit 971, a rotation driving unit 972, a sensor heating unit 973, a first pressure adjusting unit 980, and a vision unit 994. Here, the chamber 910, the second supporting unit 922, the mask assembly 923, the angle restriction unit 961, the heating unit 962, the sensor unit 971, the rotation driving unit 972, the sensor heating unit 973, the first pressure adjusting unit 980, and the vision unit 994 may be the same or substantially the same as described above with reference to FIG. 13, and thus, some repetitive description will be omitted for brevity.

The first supporting unit 921 may fix a surface of the display substrate D. Here, the first supporting unit 921 may include a vacuum chuck, an electrostatic chuck, or an adhesive chuck.

Regarding an operation of the apparatus 900 for manufacturing the display apparatus, a deposition material supplied from the source unit 930 into the chamber 910 may pass through the mask assembly 923 and may be deposited on the display substrate D. Here, the sensor unit 971 may measure the amount of the deposition material deposited on the display substrate D.

While the process described above is performed, the angle restriction unit 961 may restrict an injection angle of the deposition material injected from the source unit 930 and the heating unit 962 may remove the deposition material deposited on the angle restriction unit 961.

In the case of the sensor unit 971, after a certain period of time, the sensor unit 971 may be replaced by the new sensor unit 971 as described above, and the previously used sensor unit 971 may be renewed by the sensor heating unit 973.

Thus, according to the apparatus 900 for manufacturing the display apparatus and the method of manufacturing the display apparatus, precise deposition may be possible to increase the quality of the display apparatus.

According to the apparatus 900 for manufacturing the display apparatus and the method of manufacturing the display apparatus, wasting of the deposition material may be minimized and sequential deposition may be possible.

Figure 16:
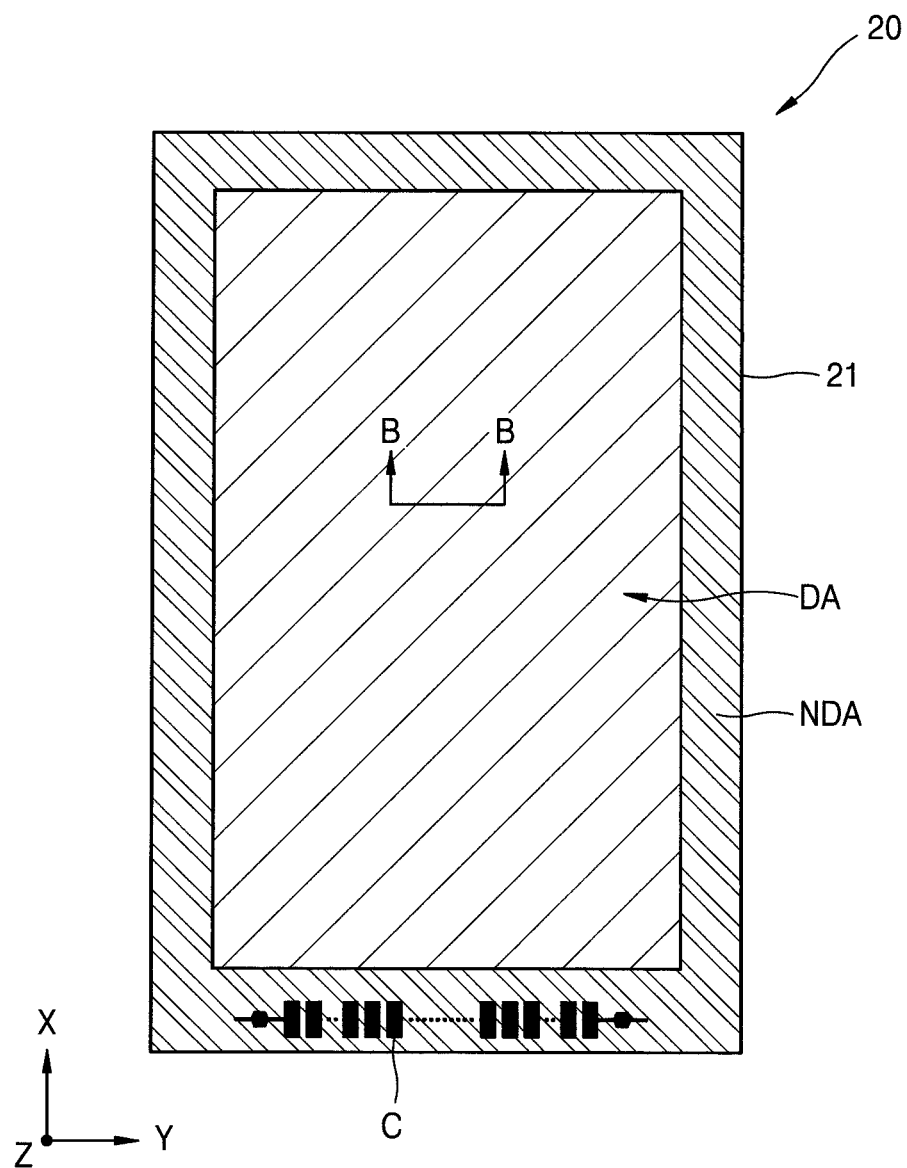
FIG. 16 is a plan view of a display apparatus manufactured by using the apparatuses for manufacturing a display apparatus illustrated in FIGS. 1 through 15.
Figure 17:
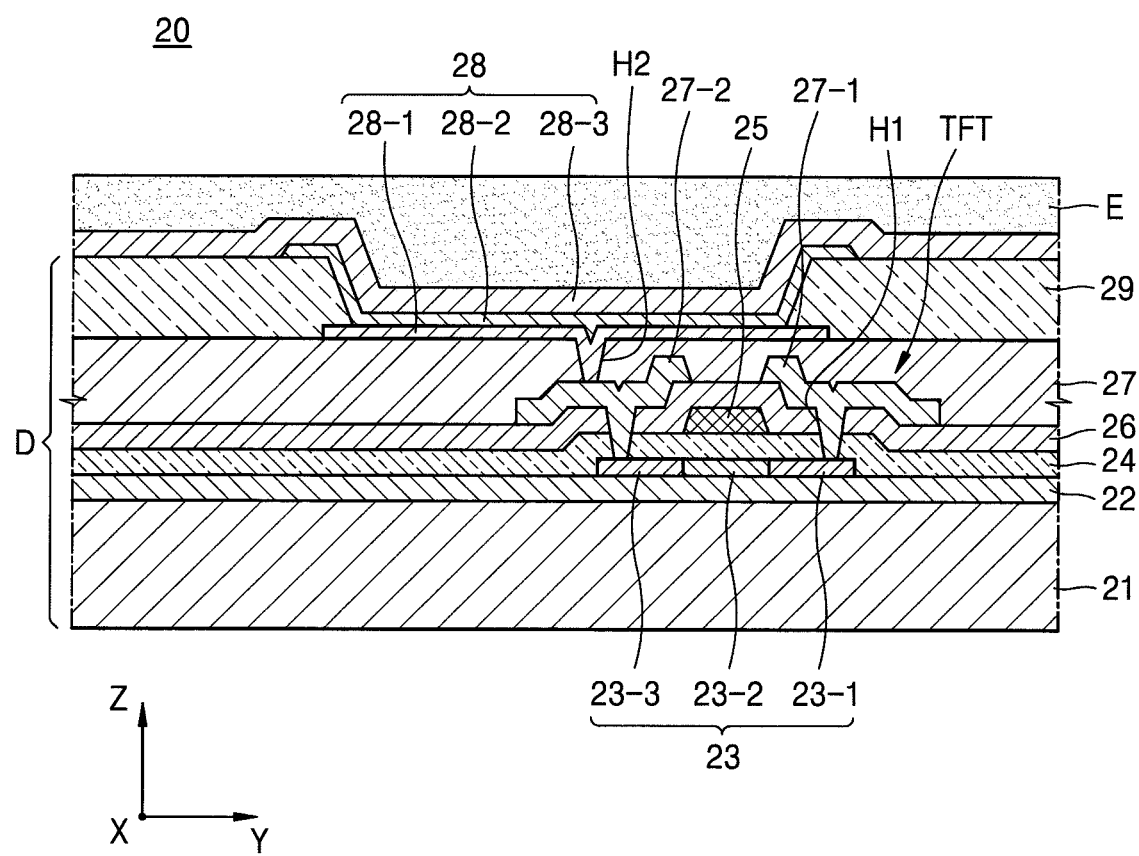
FIG. 17 is a cross-sectional view taken along the line B-B of FIG. 16.

FIG. 16 is a plan view of a display apparatus 20 manufactured by the apparatuses 100, 600, 700, 800, and 900 for manufacturing the display apparatuses according to FIGS. 1 through 15. FIG. 17 is a cross-sectional view taken along a line B-B of FIG. 16.

Referring to FIGS. 16 and 17, in the display apparatus 20, a display area DA and a non-display area NDA outside the display area DA may be defined on a substrate 21. An emission unit may be arranged in the display area DA and power wires, etc. may be arranged in the non-display area NDA. Also, a pad unit C may be arranged in the non-display area NDA.

The display apparatus 20 may include a display substrate D and a thin layer encapsulation layer E. Here, the display substrate D may include a substrate 21, a thin film transistor TFT, a passivation layer 27, and a pixel electrode 28-1.

According to another embodiment, the display substrate D may include one or more of the substrate 21, the thin film transistor TFT, the passivation layer 27, the pixel electrode 28-1, and an intermediate layer 28-2. According to another embodiment, the display substrate D may include the substrate 21, the thin film transistor TFT, the passivation layer 27, the pixel electrode 28-1, and the intermediate layer 28-2. Hereinafter, for convenience of explanation, descriptions will be given in more detail by focusing on a case in which the display substrate D includes the substrate 21, the thin film transistor TFT, the passivation layer 27, and the pixel electrode 28-1.

The substrate 21 may include a plastic member, or a metal member, such as SUS and Ti. Also, the substrate 21 may include polyimide (PI). Hereinafter, for convenience of explanation, descriptions will be given in more detail by focusing on a case in which the substrate 21 includes PI.

The thin film transistor TFT may be formed on the substrate 21 and the passivation layer 27 may be formed to cover the thin film transistor TFT, and an organic light-emitting device 28 may be formed on the passivation layer 27.

A buffer layer 22 including an organic compound and/or an inorganic compound may further be formed on an upper surface of the substrate 21, and may include SiOx (x≥1) and SiNx (x≥1).

After an active layer 23 is formed on the buffer layer 22 to have a certain pattern, the active layer 23 may be buried by a gate insulating layer 24. The active layer 23 may have a source area 23-1, a drain area 23-3, and a channel area 23-2 therebetween.

The active layer 23 may be formed to contain various materials. For example, the active layer 23 may contain an inorganic semiconductor material, such as amorphous silicon or crystalline silicon. As another example, the active layer 23 may contain an oxide semiconductor. As another example, the active layer 23 may contain an organic semiconductor material. However, hereinafter, for convenience of explanation, descriptions will be given in more detail by focusing on a case in which the active layer 23 includes amorphous silicon.

The active layer 23 may be formed by forming an amorphous silicon layer on the buffer layer 22, crystallizing the amorphous silicon layer to form a polycrystalline silicon layer, and patterning the polycrystalline silicon layer. The source area 23-1 and the drain area 23-3 of the active layer 23 may be doped with impurities, based on types of the thin film transistor TFT, such as a driving thin film transistor, a switching thin film transistor, etc.

A gate electrode 25 corresponding to the active layer 23 and an interlayer insulating layer 26 burying the gate electrode 25 may be formed on an upper surface of the gate insulating layer 24.

Also, a contact hole H1 may be formed in the interlayer insulating layer 26 and the gate insulating layer 24, and a source electrode 27-1 and a drain electrode 27-2 may be formed on the interlayer insulating layer 26 to contact the source area 23-1 and the drain area 23-3, respectively.

The passivation layer 27 may be formed above the thin film transistor TFT formed as described above, and the pixel electrode 28-1 of the organic light-emitting device 28 may be formed above the passivation layer 27. The pixel electrode 28-1 may contact the drain electrode 27-2 of the thin film transistor TFT via a via hole H2 formed in the passivation layer 27. The passivation layer 27 may be formed as a single layer or multiple layers including an inorganic material and/or an organic material and may be formed as a planarization layer so that a layer below the passivation layer 27 may have a planarized upper surface regardless of whether the layer below the passivation layer 27 is curved or not, or may be formed as a curved layer according to the layer below the passivation layer 27, the layer being curved. Also, it is that the passivation layer 27 be formed as a transparent insulator to achieve a resonance effect.

After the pixel electrode 28-1 is formed on the passivation layer 27, a pixel-defining layer 29 may be formed to cover the pixel electrode 28-1 and the passivation layer 27 by including an organic material and/or an inorganic material, and may be open to expose the pixel electrode 28-1.

Also, the intermediate layer 28-2 and an opposite electrode 28-3 may be formed at least on the pixel electrode 28-1. According to some example embodiments, the opposite electrode 28-3 may be formed on a surface of the display substrate D. In this case, the opposite electrode 28-3 may be formed on the intermediate layer 28-2 and the pixel-defining layer 29. Hereinafter, for convenience of explanation, descriptions will be given in more detail by focusing on a case in which the opposite electrode 28-3 is formed on the intermediate layer 28-2 and the pixel-defining layer 29.

The pixel electrode 28-1 may perform a function of an anode and the opposite electrode 28-3 may perform a function of a cathode. However, polarities of the pixel electrode 28-1 and the opposite electrode 28-3 may be reverse.

The pixel electrode 28-1 and the opposite electrode 28-3 may be insulated from each other via the intermediate layer 28-2, and voltages of different polarities may be applied to the intermediate layer 28-2 so that an organic emission layer may emit light.

The intermediate layer 28-2 may include the organic emission layer. As another selective example, the intermediate layer 28-2 may include the organic emission layer, and may further include at least one of a hole injection layer (HIL), a hole transport layer (HTL), an electron transport layer (ETL), and an electron injection layer (EIL). The present embodiment is not limited thereto, and the intermediate layer 28-2 may include the organic emission layer and may further include other various function layers.

The intermediate layer 28-2 may be provided in a multiple number, and the plurality of intermediate layers 28-2 may form the display area DA. For example, the plurality of intermediate layers 28-2 may form the display area DA having a shape. Here, the plurality of intermediate layers 28-2 may be arranged in the display area DA to be apart from each other.

Meanwhile, one unit pixel may include a plurality of sub-pixels, and the plurality of sub-pixels may emit light of various colors. For example, the plurality of sub-pixels may include sub-pixels emitting light of red, green, and blue colors, and may include sub-pixels emitting red, green, blue, and white colors.

According to the apparatuses 100, 600, 700, 800, and 900 for manufacturing the display apparatuses illustrated in FIGS. 1 through 15, various layers may be formed on the display substrate D. For example, according to the apparatuses 100, 600, 700, 800, and 900 for manufacturing the display apparatuses, at least one layer included in the intermediate layer 28-2 and at least one layer included in the opposite electrode 28-3 may be formed on the display substrate D. Here, according to the apparatuses 100, 600, 700, 800, and 900 for manufacturing the display apparatuses, at least one of the HIL, the HTL, the EIL, the ETL, and other function layers included in the intermediate layer 28-2 may be formed. For example, when the at least one layer included in the intermediate layer 28-2 is formed on the display substrate D in the apparatuses 100, 600, 700, 800, and 900 for manufacturing the display apparatuses, the at least one layer may be formed by using a plurality of deposition materials or a plurality of layers may be simultaneously formed.

Meanwhile, the thin film encapsulation layer E may include a plurality of inorganic layers or may include an inorganic layer and an organic layer.

The organic layer of the thin film encapsulation layer E may include a polymer, and preferably, may be a single layer or a stack including any one of polyethylene terephthalate, PI, polycarbonate, epoxy, polyethylene, and polyacrylate. More preferably, the organic layer may include polyacrylate, and for example, may include a polymerized monomer composition including a diacrylate-based monomer and a triacrylate-based monomer. The monomer composition may further include a monoacrylate-based monomer. Also, the monomer composition may further include a well-known photoinitiator, such as TPO, but is not limited thereto.

The inorganic layer of the thin film encapsulation layer E may be a single layer or a stack including metal oxide or metal nitride. For example, the inorganic layer may include any one of $SiN_x$, $Al_2O_3$, $SiO_2$, and $TiO_2$.

An uppermost layer of the thin film encapsulation layer E, the uppermost layer being exposed outside, may be formed as an inorganic layer to prevent water penetration with respect to the organic light-emitting device 28.

The thin film encapsulation layer E may include at least one sandwich structure in which at least one organic layer is inserted between at least two inorganic layers. As another example, the thin film encapsulation layer E may include at least one sandwich structure in which at least one inorganic layer is inserted between at least two organic layers. As another example, the thin film encapsulation layer E may include a sandwich structure in which at least one organic layer is inserted between at least two inorganic layers and a sandwich structure in which at least one inorganic layer is inserted between at least two organic layers.

The thin film encapsulation layer E may sequentially include, on the organic light-emitting device 28, a first inorganic layer, a first organic layer, and a second inorganic layer.

As another example, the thin film encapsulation layer E may sequentially include, on the organic light-emitting device 28, a first inorganic layer, a first organic layer, a second inorganic layer, a second organic layer, and a third inorganic layer.

As another example, the thin film encapsulation layer E may sequentially include, on the organic light-emitting device 28, a first inorganic layer, a first organic layer, a second inorganic layer, the second organic layer, a third inorganic layer, a third organic layer, and a fourth inorganic layer.

A halogenated metal layer including LiF may further be included between the organic light-emitting device and the first inorganic layer. The halagenated metal layer may prevent damage to the organic light-emitting device 28 when forming the first inorganic layer via sputtering.

The first organic layer may have a less area than the second inorganic layer, and the second organic layer may have a less area than the third inorganic layer.

Thus, the display apparatus 20 may achieve a precise image.

As described above, according to the apparatus for manufacturing the display apparatus and the method of manufacturing the display apparatus according to the one or more of the above embodiments, the manufacturing efficiency of the display apparatus may be increased.

According to the apparatus for manufacturing the display apparatus and the method of manufacturing the display apparatus according to the one or more of the above embodiments, the display apparatus achieving a precise image may be manufactured.

According to the apparatus for manufacturing the display apparatus and the method of manufacturing the display apparatus according to the one or more of the above embodiments, sequential operation may be possible, and thus, manufacturing time may be increased.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims, and their equivalents.

What is claimed is:

1. An apparatus for manufacturing a display apparatus, the apparatus comprising:
    a chamber;
    a plurality of source units outside the chamber, wherein the plurality of source units are configured to accommodate a deposition material and to transform the deposition material into gas;
    a nozzle in the chamber and connected to the plurality of source units, wherein the nozzle is configured to inject, into the chamber, the deposition material supplied from one of the plurality of source units; and
    a regulator between each of the plurality of source units and the nozzle, wherein the regulator is configured to control the deposition material supplied from each of the plurality of source units to the nozzle and to selectively connect the plurality of source units with the nozzle,
    wherein the regulator is configured to disconnect, from the nozzle, a source unit from among the plurality of source units, of which the inner temperature is greater than a pre-set temperature, and to connect, to the nozzle, a source unit from among the plurality of source units, of which the inner temperature is equal to or less than the pre-set temperature.

2. The apparatus for manufacturing a display apparatus of claim 1, the apparatus further comprising:
    a sensor in each of the plurality of source units, the sensor being configured to measure an inner temperature of each of the plurality of source units.

3. The apparatus for manufacturing a display apparatus of claim 1, wherein each of the plurality of source units is replaceable.

4. The apparatus for manufacturing a display apparatus of claim 1, the apparatus further comprising:
    a source chamber unit, in which at least one of the plurality of source units is arranged.

5. The apparatus for manufacturing a display apparatus of claim 1, wherein the nozzle comprises:
    a first nozzle unit connected to at least one of the plurality of source units; and a second nozzle unit separated from the first nozzle and connected to at least one other source unit among the plurality of source units.

6. The apparatus for manufacturing a display apparatus of claim 5, wherein a first nozzle of the first nozzle unit and a second nozzle of the second nozzle unit are between a center of the first nozzle unit and a center of the second nozzle unit.

7. The apparatus for manufacturing a display apparatus of claim 6, wherein the first nozzle and the second nozzle are arranged in a line.

8. The apparatus for manufacturing a display apparatus of claim 6, wherein one of the first nozzle and the second nozzle is inside the other of the first nozzle and the second nozzle.

9. The apparatus for manufacturing a display apparatus of claim 6, wherein at least one of the first nozzle and the second nozzle is inclined.

10. The apparatus for manufacturing a display apparatus of claim 6, wherein the deposition material injected from the first nozzle and the deposition material injected from the second nozzle are different from each other.

11. The apparatus for manufacturing a display apparatus of claim 1, the apparatus further comprising:
an angle restrictor, wherein the angle restrictor is configured to restrict an injection angle of the deposition material injected from the nozzle.

12. The apparatus for manufacturing a display apparatus of claim 11, the apparatus further comprising:
a heater in at least a portion of the angle restrictor, wherein the heater is configured to heat the at least a portion of the angle restrictor.

13. The apparatus for manufacturing a display apparatus of claim 11, wherein the angle restrictor comprises:
an angle restriction belt; and
a belt driver configured to rotate the angle restriction belt.

14. The apparatus for manufacturing a display apparatus of claim 13, wherein the angle restrictor further comprises:
a belt cooler configured to cool a surface of the angle restriction belt.

15. The apparatus for manufacturing a display apparatus of claim 13, wherein the angle restrictor further comprises:
a belt heater configured to heat a surface of the angle restriction belt.

16. The apparatus for manufacturing a display apparatus of claim 15, the apparatus further comprising:
a deposition material collector apart from the angle restriction belt, wherein the deposition material collector is configured to collect at least a portion of the deposition material escaping from the angle restriction belt due to heating by the belt heater.

17. The apparatus for manufacturing a display apparatus of claim 1, the apparatus further comprising:
a sensor configured to measure a concentration of the deposition material injected from the nozzle.

18. The apparatus for manufacturing a display apparatus of claim 17, the apparatus further comprising:
a rotation driver connected to the sensor and configured to rotate the sensor; and
a sensor heater configured to remove the deposition material from the sensor by heating the sensor.

19. An apparatus for manufacturing a display apparatus, the apparatus comprising:
a chamber;
a first source unit configured to accommodate a first deposition material and comprising a first nozzle unit having a first nozzle, wherein the first nozzle is configured to supply the first deposition material into the chamber; and
a second source unit configured to accommodate a second deposition material and comprising a second nozzle unit having a second nozzle, wherein the second nozzle is configured to supply the second deposition material into the chamber,
wherein the first nozzle and the second nozzle are between a center of the first nozzle unit and a center of the second nozzle unit.

20. The apparatus for manufacturing a display apparatus of claim 19, wherein at least one of the first nozzle and the second nozzle is inclined.

21. The apparatus for manufacturing a display apparatus of claim 19, wherein the first nozzle and the second nozzle are arranged in a line.

22. The apparatus for manufacturing a display apparatus of claim 19, wherein one of the first nozzle and the second nozzle is inside the other of the first nozzle and the second nozzle.

23. The apparatus for manufacturing a display apparatus of claim 19, the apparatus further comprising:
an angle restrictor, wherein the angle restrictor is configured to restrict an injection angle of at least one of the first deposition material injected from the first nozzle and the second deposition material injected from the second nozzle.

24. The apparatus for manufacturing a display apparatus of claim 23, the apparatus further comprising:
a heater configured to remove at least one of the first deposition material and the second deposition material deposited on the angle restrictor.

25. The apparatus for manufacturing a display apparatus of claim 19, the apparatus further comprising
a sensor configured to measure at least one of a concentration of the first deposition material injected from the first nozzle and a concentration of the second deposition material injected from the second nozzle.

26. The apparatus for manufacturing a display apparatus of claim 25, the apparatus further comprising:
a rotation driver connected to the sensor and configured to rotate the sensor; and
a sensor heater configured to remove at least one of the first and second deposition materials from the sensor by heating the sensor.

27. An apparatus for manufacturing a display apparatus, the apparatus comprising:
a chamber;
a source unit in the chamber, wherein the source unit is configured to supply a deposition material into the chamber;
an angle restriction belt in the source unit or apart from the source unit, wherein the angle restriction belt is configured to rotate and restrict an injection angle of the deposition material injected from the source unit;
a belt driver configured to rotate the angle restriction belt;
a belt cooler configured to cool a surface of the angle restriction belt; and
a belt heater configured to heat the surface of the angle restriction belt.

28. The apparatus for manufacturing a display apparatus of claim 27, the apparatus further comprising:
a deposition material collector apart from the angle restriction belt, wherein the deposition material collector is configured to collect at least a portion of the deposition material escaping from the angle restriction belt due to heating by the belt heater.

29. The apparatus for manufacturing a display apparatus of claim 27, the apparatus further comprising:
a sensor configured to measure a concentration of the deposition material injected from the source unit.

30. The apparatus for manufacturing a display apparatus of claim 29, the apparatus further comprising:
a rotation driver connected to the sensor and configured to rotate the sensor; and
a sensor heater configured to remove the deposition material from the sensor by heating the sensor.

31. An apparatus for manufacturing a display apparatus, the apparatus comprising:
a chamber;
a source unit in the chamber, wherein the source unit is configured to supply a deposition material into the chamber;
a sensor configured to measure a concentration of the deposition material injected from the source unit;
a rotation driver connected to the sensor and configured to rotate the sensor; and
a sensor heater configured removes the deposition material from the sensor by heating the sensor.

32. A method of manufacturing a display apparatus, the method comprising:
arranging a display panel and a mask assembly in a chamber;
supplying, into the chamber, a deposition material from at least one of a plurality of source units and depositing the deposition material on the display panel;
measuring an inner temperature of at least one of the plurality of source units;
comparing the measured inner temperature of the at least one of the plurality of source units with a pre-set temperature;
interrupting the deposition material supplied from the at least one of the plurality of source units into the chamber; and
supplying the deposition material from at least another of the plurality of source units into the chamber.

33. The method of claim 32, wherein the plurality of source units are accommodated in a source chamber unit which is different from the chamber.

34. The method of claim 32, wherein the plurality of source units are outside the chamber, and
a nozzle in the chamber is connected to the plurality of source units and is configured to inject the deposition material into the chamber.

35. The method of claim 32, wherein at least one of the plurality of source units supplies, into the chamber, the deposition material, which is different from the deposition material supplied from at least another of the plurality of source units.

36. The method of claim 35, wherein each of the plurality of source units comprises a nozzle configured to guide the deposition material, and
the nozzle of the source units adjacent to each other are between centers of the source units adjacent to each other.

37. The method of claim 35, wherein each of the plurality of source units comprises a nozzle configured to guide the deposition material, and
nozzles of the source units adjacent to each other are arranged in a row.

38. The method of claim 35, wherein each of the plurality of source units comprises a nozzle configured to guide the deposition material, and
one nozzle of the source units adjacent to each other is in another nozzle an adjacent source unit.

39. The method of claim 32, wherein an angle of the deposition material supplied from each of the plurality of source units is restricted by an angle restrictor in at least one of the plurality of source units or apart from at least one of the plurality of source units.

40. The method of claim 39, further comprising removing the deposition material deposited on the angle restrictor by heating the angle restrictor.

41. The method of claim 39, further comprising allowing the deposition material to be deposited on the angle restrictor via adsorbing heat of the angle restrictor.

42. The method of claim 32, further comprising measuring, via a first sensor, an evaporation rate of the deposition material supplied from the at least one of the plurality of source units.

43. The method of claim 42, further comprising replacing the first sensor with a second sensor which is different from the first sensor, after a certain time period.

44. The method of claim 43, further comprising removing the deposition material deposited on the first sensor by heating the first sensor.

45. A method of manufacturing a display apparatus, the method comprising:
arranging a display panel and a mask assembly in a chamber;
supplying, into the chamber, a first deposition material from a first source unit;
supplying, into the chamber, a second deposition material from a second source unit; and
depositing the first deposition material and the second deposition material on the display panel,
wherein the first source unit comprises a first nozzle unit having a first nozzle configured to guide the first deposition material, the second source unit comprises a second nozzle unit having a second nozzle configured to guide the second deposition material, and the first nozzle and the second nozzle are between a center of the first nozzle unit and a center of the second nozzle unit.

46. The method of claim 45, wherein the first nozzle and the second nozzle are arranged in a line.

47. The method of claim 45, wherein one of the first nozzle and the second nozzle is in the other of the first nozzle and the second nozzle.

48. The method of claim 45, further comprising restricting injection angles of the first deposition material and the second deposition material via an angle restrictor in at least one of the first nozzle and the second nozzle or apart from at least one of the first nozzle and the second nozzle.

49. The method of claim 48, further comprising removing at least one of the first and second deposition materials deposited on the angle restrictor by heating the angle restrictor.

50. The method of claim 48, further comprising allowing at least one of the first and second deposition materials to be deposited on the angle restrictor via adsorbing heat of the angle restrictor.

51. The method of claim 45, further comprising measuring, via a first sensor, an evaporation rate of at least one of the first and second deposition material supplied from at least one of the first and second source units.

52. The method of claim 51, further comprising replacing the first sensor with a second sensor which is different from the first sensor, after a certain time period.

53. The method of claim 52, further comprising heating the first sensor and thereby removing at least one of the first and second deposition materials deposited on the first sensor.

54. A method of manufacturing a display apparatus, the method comprising:
arranging a display panel and a mask assembly in a chamber;
supplying, into the chamber, a deposition material from a source unit and depositing the deposition material on the display panel;
measuring, via a first sensor, an evaporation rate of the deposition material injected from the source unit; and
replacing the first sensor with a second sensor which is different from the first sensor, after a certain time period.

55. The method of claim 54, further comprising heating the first sensor which is replaced, thereby removing the deposition material deposited on the first sensor.

56. An apparatus for manufacturing a display apparatus, the apparatus comprising:
a chamber;
a plurality of source units outside the chamber, wherein the plurality of source units are configured to accommodate a deposition material and to transform the deposition material into gas;
a nozzle unit in the chamber and connected to the plurality of source units, wherein the nozzle unit is configured to inject, into the chamber, the deposition material supplied from one of the plurality of source units; and
a regulation unit between each of the plurality of source units and the nozzle unit, wherein the regulation unit is configured to control the deposition material supplied from each of the plurality of source units to the nozzle unit and to selectively connect the plurality of source units with the nozzle unit,
wherein the regulation unit is configured to disconnect, from the nozzle unit, a source unit from among the plurality of source units, of which the deposition material is exhausted, and to connect, to the nozzle unit, a source unit from among the plurality of source units, of which the deposition material is not exhausted.

\* \* \* \* \*